(12) United States Patent
Lee et al.

(10) Patent No.: US 11,783,779 B2
(45) Date of Patent: Oct. 10, 2023

(54) PIXEL CIRCUIT AND DISPLAY DEVICE INCLUDING THE SAME

(71) Applicant: LG DISPLAY CO., LTD., Seoul (KR)

(72) Inventors: Yong Won Lee, Paju-si (KR); Ki Young Kwon, Paju-si (KR); Seo Jun Yeom, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/952,040

(22) Filed: Sep. 23, 2022

(65) Prior Publication Data

US 2023/0094280 A1 Mar. 30, 2023

(30) Foreign Application Priority Data

Sep. 27, 2021 (KR) .................. 10-2021-0127053
Dec. 14, 2021 (KR) .................. 10-2021-0178251

(51) Int. Cl.
*G09G 3/3258* (2016.01)
*G09G 3/3266* (2016.01)
*H10K 59/12* (2023.01)
*H10K 59/35* (2023.01)

(52) U.S. Cl.
CPC ......... *G09G 3/3258* (2013.01); *G09G 3/3266* (2013.01); *G09G 2300/0819* (2013.01); *G09G 2300/0852* (2013.01); *G09G 2300/0861* (2013.01); *G09G 2310/0286* (2013.01); *G09G 2310/0297* (2013.01); *G09G 2310/08* (2013.01); *G09G 2320/0233* (2013.01); *H10K 59/12* (2023.02); *H10K 59/35* (2023.02)

(58) Field of Classification Search
None
See application file for complete search history.

(56) References Cited

U.S. PATENT DOCUMENTS

| | | | |
|---|---|---|---|
| 10,672,338 B2 | 6/2020 | Lin et al. | |
| 10,878,751 B2 | 12/2020 | Lin et al. | |
| 11,348,520 B2 | 5/2022 | Kim et al. | |
| 2013/0120228 A1* | 5/2013 | Yoon .................... | G09G 3/3233 345/80 |

(Continued)

FOREIGN PATENT DOCUMENTS

| | | |
|---|---|---|
| KR | 10-2019-0040849 A | 4/2019 |
| KR | 10-2019-0108162 A | 9/2019 |
| KR | 10-2021-0083644 A | 7/2021 |

*Primary Examiner* — Nitin Patel
*Assistant Examiner* — Amen W Bogale
(74) *Attorney, Agent, or Firm* — Fenwick & West LLP

(57) ABSTRACT

A pixel circuit includes: a driving element including a first electrode connected to a first node to which a pixel driving voltage is applied, a gate electrode connected to a second node, and a second electrode connected to a third node; a light emitting element including an anode electrode connected to the third node, and a cathode electrode connected to a power line; a first switch element to supply a data voltage of pixel data to the second node; a second switch element to supply an initialization voltage to the second node; a third switch element to supply a reference voltage to the third node; a fourth switch element configured to connect the third node to a power line to reset a voltage of the anode electrode of the light emitting element to the pixel reference voltage; and a capacitor between the second and third node.

19 Claims, 26 Drawing Sheets

(56) References Cited

U.S. PATENT DOCUMENTS

| | | | |
|---|---|---|---|
| 2013/0127692 A1* | 5/2013 | Yoon | G09G 3/3258 |
| | | | 345/80 |
| 2014/0035799 A1* | 2/2014 | Bae | G09G 3/3233 |
| | | | 345/82 |
| 2018/0144717 A1* | 5/2018 | Kim | G09G 5/10 |
| 2018/0277037 A1 | 9/2018 | Lin et al. | |
| 2020/0312234 A1 | 10/2020 | Lin et al. | |
| 2021/0065629 A1* | 3/2021 | Yang | G09G 3/3275 |
| 2021/0201798 A1 | 7/2021 | Kim et al. | |
| 2022/0139333 A1* | 5/2022 | Jin | G09G 3/3233 |
| | | | 345/214 |
| 2022/0189401 A1* | 6/2022 | Dong | G09G 3/3291 |

* cited by examiner

PIXEL CIRCUIT AND DISPLAY DEVICE INCLUDING THE SAME

CROSS-REFERENCE TO RELATED APPLICATIONS

This application claims priority to and the benefit of Republic of Korea Patent Application No. 10-2021-0127053, filed on Sep. 27, 2021, and Republic of Korea Patent Application No. 10-2021-0178251, filed on Dec. 14, 2021, each of which is hereby incorporated by reference in its entirety.

BACKGROUND

1. Field

The present disclosure relates to a pixel circuit and a display device including the same.

2. Discussion of Related Art

An electroluminescence display device may be divided into an inorganic light emitting display device and an organic light emitting display device according to the material of the emission layer. The active matrix type organic light emitting display device includes an organic light emitting diode (hereinafter, referred to as "OLED") that emits light by itself, and has the advantage of fast response speed, high light-emitting efficiency, high luminance and wide viewing angle. In the organic light emitting display device, the organic light emitting diode (OLED) is formed in each pixel. The organic light emitting display device has a fast response speed, excellent light-emitting efficiency, luminance, and viewing angle, and has also excellent contrast ratio and color reproducibility because black gray scale can be expressed as complete black color.

A frame frequency of an image inputted to pixels of an organic light emitting display device may be changed. When the frame frequency of the input image is changed, a holding time from when the data voltage of the pixel data is charged in the pixels until the data voltage of the next pixel data is charged is changed. When the holding time is changed, the amount of current flowing through the light emitting element is reduced, so that the luminance of the pixels is reduced. As a result, flicker may be visually recognized on the screen.

SUMMARY

An object of the present disclosure is to solve the above-mentioned necessity and/or problems.

The present disclosure provides a pixel circuit capable of improving image quality by suppressing variations in luminance of pixels when a frame frequency is changed, and a display device including the same.

The problems of the present disclosure are not limited to those mentioned above, and other problems not mentioned will be clearly understood by those skilled in the art from the following description.

In one embodiment, a pixel circuit comprises: a driving element including a first electrode of the driving element that is connected to a first node to which a pixel driving voltage is applied via a first power line, a gate electrode of the driving element that is connected to a second node, and a second electrode of the driving element that is connected to a third node; a light emitting element including an anode electrode that is connected to the third node, and a cathode electrode connected to a second power line through which a pixel reference voltage is applied, the light emitting element configured to be driven by a current from the driving element; a first switch element configured to supply a data voltage of pixel data of an image to the second node responsive to a scan pulse being applied to the first switch element; a second switch element configured to supply an initialization voltage to the second node responsive to an initialization pulse being applied to the second switch element; a third switch element configured to supply a reference voltage to the third node responsive to a sensing pulse being applied to the third switch element; a fourth switch element configured to connect the third node to the second power line responsive to an anode reset pulse being applied to the fourth switch element, the connection of the third node to the second power line resetting a voltage of the anode electrode of the light emitting element to the pixel reference voltage; and a capacitor connected between the second node and the third node.

In one embodiment, a pixel circuit comprises: a driving element including a first electrode of the driving element that is connected to a first node to which a pixel driving voltage is applied via a first power line, a gate electrode of the driving element that is connected to a second node, and a second electrode of the driving element that is connected to a third node; a light emitting element including an anode electrode connected to the third node, and a cathode electrode connected to a second power line through which a pixel reference voltage that is less than the pixel driving voltage is applied, the light emitting element configured to be driven by a current from the driving element; a first switch element configured to supply a data voltage of pixel data of an image to the second node responsive to a scan pulse being applied to the first switch element; a second switch element configured to supply an initialization voltage to the second node responsive to an initialization pulse being applied to the second switch element; a third switch element configured to supply a reference voltage that is less than the initialization voltage to the third node while the data voltage is not supplied to the second node responsive to a sensing pulse being applied to the third switch element, the supply of the reference voltage to the third node resets a voltage of the anode electrode of the light emitting element to the reference voltage; a fourth switch element configured to connect the third node to a fourth node responsive to an anode reset pulse being applied to the fourth switch element; and a capacitor connected between the second node and the fourth node.

In one embodiment, a display device comprises: a display panel including a plurality of pixels configured to display an image at one of a plurality of different frame frequencies, the plurality of different frame frequencies including a first frame frequency and a second frame frequency that is different from the first frame frequency; a data driver configured to generate a data voltage of pixel data of the image; and a gate driver configured to generate a scan pulse, wherein at least one of the plurality of pixel circuits includes: a driving element including a first electrode of the driving element that is connected to a first node to which a pixel driving voltage is applied via a first power line, a gate electrode of the driving element that is connected to a second node, and a second electrode of the driving element that is connected to a third node; a light emitting element including an anode electrode connected to the third node, and a cathode electrode connected to a second power line through which a pixel reference voltage that is less than the pixel driving voltage is applied, the light emitting element configured to be driven by a current from the driving element; a first switch element configured to supply the data voltage of the pixel data of the image to the second node responsive to the scan pulse being applied to the first switch element; and a second switch element connected to the third node, the second switch element configured to supply a predetermined voltage to the anode electrode of the light emitting element while the data voltage is not supplied to the second node, the supply of the predetermined voltage resetting a voltage of the anode electrode of the light emitting element to the predetermined voltage.

According to the present disclosure, when a frame frequency of an input image is varied, an anode reset may be performed on the pixels at a constant frequency, thereby suppressing variations in luminance of the pixels to improve the image quality.

According to the present disclosure, the anode reset may be performed without additionally connecting an anode reset voltage line to the pixel circuit.

According to the present disclosure, variations in an anode voltage of the light emitting element may be suppressed when performing the anode reset.

Effects of the present disclosure are not limited to those mentioned above, and other effects not mentioned will be clearly understood by those skilled in the art from the description of the claims.

BRIEF DESCRIPTION OF THE DRAWINGS

The above and other objects, features, and advantages of the present disclosure will become more apparent to those of ordinary skill in the art by describing exemplary embodiments thereof in detail with reference to the attached drawings, in which.

DETAILED DESCRIPTION

Figure 1:
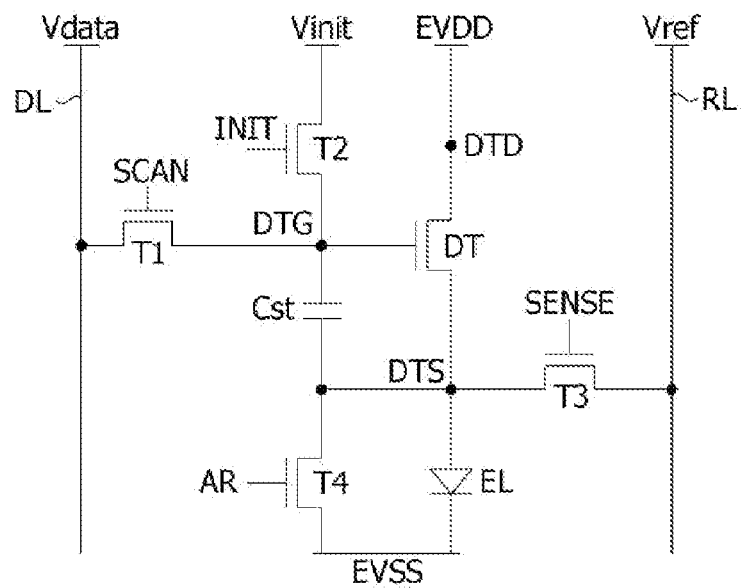
FIG. 1 is a circuit diagram illustrating a pixel circuit according to a first embodiment of the present disclosure.

The advantages and features of the present disclosure and methods for accomplishing the same will be more clearly understood from embodiments described below with reference to the accompanying drawings. However, the present disclosure is not limited to the following embodiments but may be implemented in various different forms. Rather, the present embodiments will make the disclosure of the present disclosure complete and allow those skilled in the art to completely comprehend the scope of the present disclosure. The present disclosure is only defined within the scope of the accompanying claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in describing the present disclosure, detailed descriptions of known related technologies may be omitted to avoid unnecessarily obscuring the subject matter of the present disclosure.

The terms such as "comprising," "including," and "having" used herein are generally intended to allow other components to be added unless the terms are used with the term "only." Any references to singular may include plural unless expressly stated otherwise.

Components are interpreted to include an ordinary error range even if not expressly stated.

When the position relation between two components is described using the terms such as "on," "above," "below," and "next," one or more components may be positioned between the two components unless the terms are used with the term "immediately" or "directly."

The terms "first," "second," and the like may be used to distinguish components from each other, but the functions or structures of the components are not limited by ordinal numbers or component names in front of the components.

The following embodiments can be partially or entirely bonded to or combined with each other and can be linked and operated in technically various ways. The embodiments can be carried out independently of or in association with each other.

Each of the pixels may include a plurality of sub-pixels having different colors to in order to reproduce the color of the image on a screen of the display panel. Each of the sub-pixels includes a transistor used as a switch element or a driving element. Such a transistor may be implemented as a thin film transistor (TFT).

A driving circuit of the display device writes a pixel data of an input image to pixels on the display panel. To this end, the driving circuit of the display device may include a data driving circuit configured to supply data signal to the data lines, a gate driving circuit configured to supply a gate signal to the gate lines, and the like.

In a display device of the present disclosure, the pixel circuit and the gate driving circuit may include a plurality of transistors. Transistors may be implemented as oxide thin film transistors (oxide TFTs) including an oxide semiconductor, low temperature polysilicon (LTPS) TFTs including low temperature polysilicon, or the like. In embodiments, descriptions will be given based on an example in which the transistors of the pixel circuit and the gate driving circuit are implemented as the n-channel oxide TFTs, but the present disclosure is not limited thereto.

Generally, a transistor is a three-electrode element including a gate, a source, and a drain. The source is an electrode that supplies carriers to the transistor. In the transistor, carriers start to flow from the source. The drain is an electrode through which carriers exit from the transistor. In a transistor, carriers flow from a source to a drain. In the case of an n-channel transistor, since carriers are electrons, a source voltage is a voltage lower than a drain voltage such that electrons may flow from a source to a drain. The n-channel transistor has a direction of a current flowing from the drain to the source. In the case of a p-channel transistor, since carriers are holes, a source voltage is higher than a drain voltage such that holes may flow from a source to a drain. In the p-channel transistor, since holes flow from the source to the drain, a current flows from the source to the drain. It should be noted that a source and a drain of a transistor are not fixed. For example, a source and a drain may be changed according to an applied voltage. Therefore, the disclosure is not limited due to a source and a drain of a transistor. In the following description, a source and a drain of a transistor will be referred to as a first electrode and a second electrode.

A gate signal swings between a gate-on voltage and a gate-off voltage. The gate-on voltage is set to a voltage greater than a threshold voltage of a transistor, and the gate-off voltage is set to a voltage less than the threshold voltage of the transistor.

The transistor is turned on in response to the gate-on voltage and is turned off in response to the gate-off voltage. In the case of an n-channel transistor, a gate-on voltage may be a gate high voltage, and a gate-off voltage may be a gate low voltage.

Hereinafter, various embodiments of this disclosure will be described with reference to the accompanying drawings. In the following embodiments, the display device will be described mainly with respect to the organic light emitting display device, but this disclosure is not limited thereto. Also, the scope of this disclosure is not intended to be limited by the names of components or signals in the following embodiments and claims.

Figure 2:
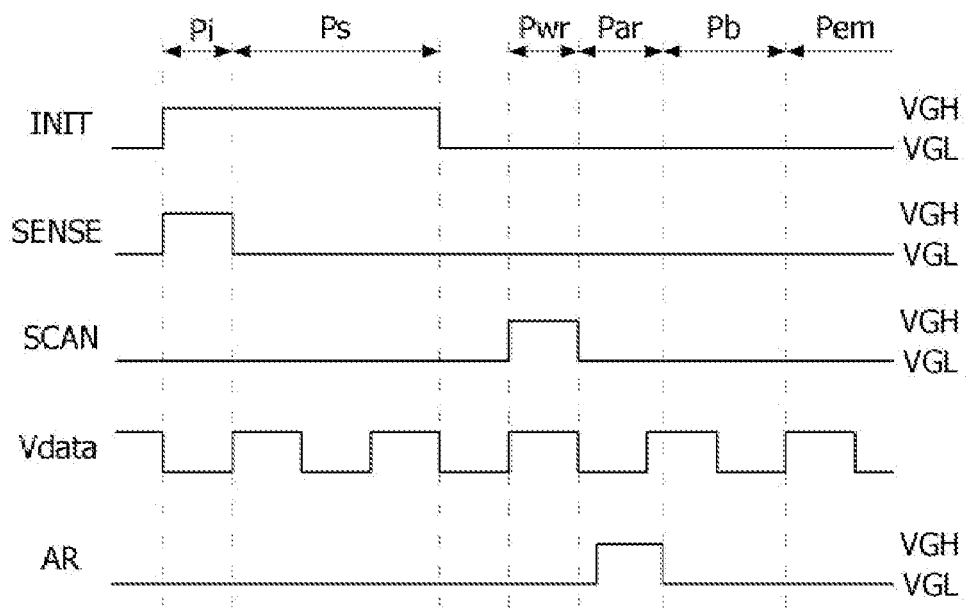
FIG. 2 is a waveform diagram illustrating a gate signal and a data voltage applied to the pixel circuit shown in FIG. 1 according to the first embodiment of the present disclosure.

FIG. 1 is a circuit diagram illustrating a pixel circuit according to a first embodiment of the present disclosure. FIG. 2 is a waveform diagram illustrating a gate signal and a data voltage applied to the pixel circuit shown in FIG. 1 according to the first embodiment of the present disclosure. FIGS. 3 to 7 are diagrams illustrating the operation of the pixel circuit shown in FIG. 1 in stages according to the first embodiment of the present disclosure.

Referring to FIGS. 1 to 7, a pixel circuit includes a light emitting element EL, a driving element DT for driving the light emitting element EL, a plurality of switch elements T1 to T4, and a capacitor Cst. The driving element DT and the switch elements T1 to T4 may be implemented with n-channel oxide TFTs. In one embodiment, the switch element T4 may be considered "a second switch."

The pixel circuit is connected to a data line DL through which a data voltage Vdata is applied and gate lines through which gate signals SCAN, INIT, SENSE, and AR are applied. In addition, the pixel circuit is connected to power lines through which direct current (DC) voltages (or constant voltages) are applied, such as a VDD line through which a pixel driving voltage EVDD is applied, a VSS line through which a pixel reference voltage EVSS is applied, an INIT line through which an initialization voltage Vinit is applied, and a REF line RL through which a reference voltage Vref is applied. The power lines may be commonly connected to all pixels.

The pixel driving voltage EVDD is set to a voltage greater than the maximum voltage of the data voltage Vdata and at which the driving element DT can operate in a saturation region. The initialization voltage Vinit may be set to a voltage between the maximum voltage and the minimum voltage of the data voltage Vdata. The pixel reference voltage EVSS is set to a voltage less than the minimum voltage of the data voltage Vdata. The reference voltage Vref may be set to a voltage less than the pixel reference voltage EVSS.

The gate signals SCAN, INIT, SENSE, and AR are generated as pulses swinging between a gate-on voltage VGH and a gate-off voltage VGL. The gate signals SCAN, INIT, SENSE, and AR include a scan pulse SCAN, an initialization pulse INIT, a sensing pulse SENSE, and an anode reset pulse AR. The gate-on voltage VGH may be set to a voltage greater than the pixel driving voltage EVDD. The gate-off voltage VGL may be set to a voltage less than the reference voltage Vref. A gate driver of the display device may include a first shift register for generating the scan pulse SCAN, a second shift register for generating the initialization pulse INIT, a third shift register for generating the sensing pulse SENSE, and a fourth shift register for generating the anode reset pulse AR.

As shown in FIG. 2, a driving period of the pixel circuit may be divided into an initialization period (or step) Pi, a sensing period Ps, a data writing period Pwr, an anode reset period Par, a boosting period Pb, and a light emission period Pem.

In the initialization period Pi, as shown in FIG. 2, the initialization pulse INIT and the sensing pulse SENSE are generated at the gate-on voltage VGH. In the initialization step Pi, the scan pulse SCAN and the anode reset pulse AR are at the gate-off voltage VGL.

In the sensing period Ps, as shown in FIG. 2, the initialization pulse INIT is generated at the gate-on voltage VGH. The sensing pulse SENSE, the scan pulse SCAN, and the anode reset pulse AR are at the gate-off voltage VGL in the sensing step Ps.

In the data writing period Pwr, as shown in FIG. 2, the scan pulse SCAN is generated at the gate-on voltage VGH synchronized with the data voltage Vdata of the pixel data. The initialization pulse INIT, the sensing pulse SENSE, and the anode reset pulse AR are at the gate-off voltage VGL in the data writing period Pwr.

In the anode reset period Par, as shown in FIG. 2, the anode reset pulse AR is generated at the gate-on voltage VGH. The initialization pulse INIT, the sensing pulse SENSE, and the scan pulse SCAN are at the gate-off voltage VGL in the anode reset step Par.

In the boosting period Pb and the light emission period Pem, all the gate signals SCAN, INIT, SENSE, and AR are maintained at the gate-off voltage VGL.

The light emitting element EL may be implemented with an OLED. The OLED includes an organic compound layer formed between an anode electrode and a cathode electrode. The organic compound layer may include a hole injection layer (HIL), a hole transport layer (HTL), an emission layer (EML), an electron transport layer (ETL), and an electron injection layer (EIL), but is not limited thereto. When a voltage is applied to the anode and cathode electrodes of the light emitting element EL, holes passing through the hole transport layer (HTL) and electrons passing through the electron transport layer (ETL) move to the emission layer (EML) to form excitons. In this case, visible light is emitted from the emission layer (EML). The anode electrode of the light emitting element EL is connected to a third node DTS. The pixel reference voltage EVSS is applied to the cathode electrode of the light emitting element EL. The light emitting element EL includes a capacitor connected between the anode electrode and the cathode electrode. The capacitor of the light emitting element EL is omitted from the drawing.

The driving element DT generates a current according to a gate-source voltage Vgs to drive the light emitting element EL. The driving element DT includes a first electrode connected to a first node DTD, a gate electrode connected to a second node DTG, and a second electrode connected to the third node DTS. The first node DTD may be connected to the VDD line through which the pixel driving voltage EVDD is applied.

The capacitor Cst is connected between the second node DTG and the third node DTS to store the gate-source voltage of the driving element DT.

The switch elements T1 to T4 of the pixel circuit include a first switch element T1 for supplying the data voltage Vdata of the pixel data to the second node DTG in response to the scan pulse SCAN, a second switch element T2 for supplying the initialization voltage Vinit to the second node DTG in response to the initialization pulse INIT, a third switch element T3 for supplying the reference voltage Vref to the third node DTS in response to the sensing pulse SENSE, and a fourth switch element T4 for connecting the third node DTS to the VSS line through which the pixel reference voltage EVSS is applied in response to the anode reset pulse AR.

The first switch element T1 is turned on in response to the gate-on voltage VGH of the scan pulse SCAN synchronized with the data voltage Vdata of the pixel data in the data writing period Pwr to connect the data line DL to the second node DTG. The data voltage Vdata is applied to the second node DTG in the data writing period Pwr. The first switch element T1 includes a first electrode connected to the data line DL through which the data voltage Vdata is applied, a gate electrode connected to a first gate line through which the scan pulse SCAN is applied, and a second electrode connected to the second node DTG.

The second switch element T2 is turned on in response to the gate-on voltage VGH of the initialization pulse INIT in the initialization period Pi and the sensing period Ps to supply the initialization voltage Vinit to the second node DTG. The second switch element T2 includes a first electrode connected to the INIT line through which the initialization voltage Vinit is applied, a gate electrode connected to a second gate line through which the initialization pulse INIT is applied, and a second electrode connected to the second node DTG.

The third switch element T3 is turned on in response to the gate-on voltage VGH of the sensing pulse SENSE in the initialization period Pi to supply the reference voltage Vref to the third node DTS. The third switch element T3 includes a first electrode connected to the third node DTS, a gate electrode connected to a third gate line through which the sensing pulse SENSE is applied, and a second electrode connected to the REF line RL through which the reference voltage Vref is applied.

The fourth switch element T4 is turned on in response to the gate-on voltage VGH of the anode reset pulse AR in the anode reset period Par to connect the third node DTS to the VSS line. The fourth switch element T4 includes a gate electrode connected to a fourth gate line through which the anode reset pulse AR is applied, a first electrode connected to the third node DTS, and a second electrode connected to the VSS line.

Figure 3:
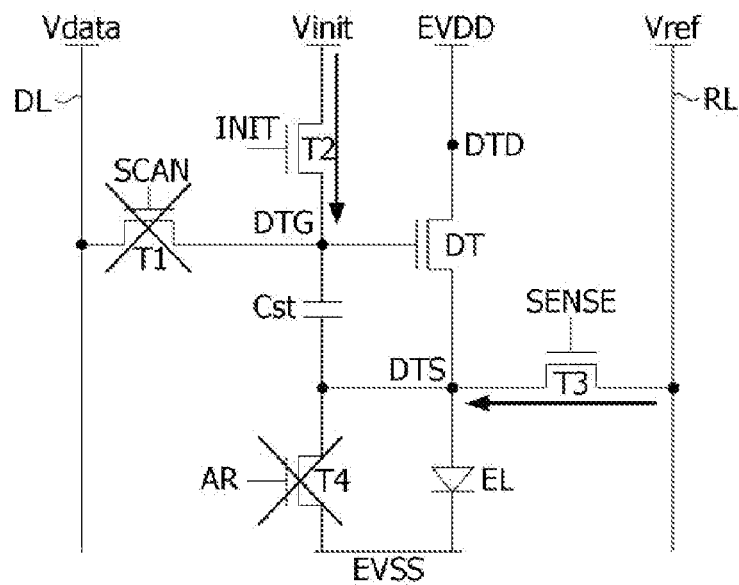
FIG. 3 is a circuit diagram illustrating an initialization period of the pixel circuit shown in FIG. 1 according to the first embodiment of the present disclosure.

In the initialization period Pi, as shown in FIG. 3, the second and third switch elements T2 and T3 and the driving element DT are turned on, and the first and fourth switch elements T1 and T4 are turned off. In this case, the light emitting element EL is not turned on. In the initialization period Pi, the main nodes of the pixel circuit are initialized. In the initialization period Pi, a voltage Vg of the second node DTG is the initialization voltage Vinit, and a voltage Vs of the third node DTS is the reference voltage Vref. Accordingly, in the initialization period Pi, the gate-source voltage Vgs of the driving element DT has a value of Vinit−Vref.

Figure 4:
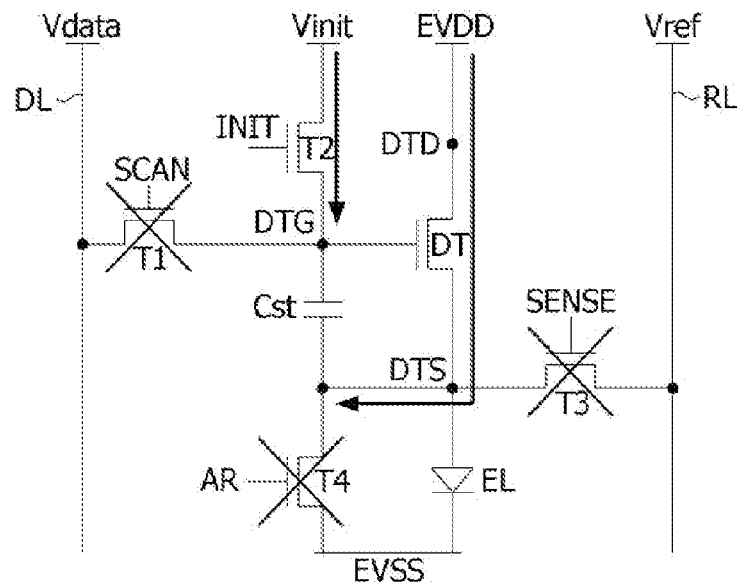
FIG. 4 is a circuit diagram illustrating a sensing period of the pixel circuit shown in FIG. 1 according to the first embodiment of the present disclosure.

In the sensing period Ps, as shown in FIG. 4, the second switch element T2 is turned on, while the first, third, and fourth switch elements T1, T3, and T4 are turned off. In the sensing period Ps, the gate-source voltage Vgs of the driving element DT reaches the threshold voltage Vth. In the sensing period Ps, the voltage Vs of the third node DTS is changed to a value of Vinit−Vth. Here, "Vth" is the threshold voltage of the driving element DT. Accordingly, at the end of the sensing period Ps, the gate-source voltage Vgs of the driving element DT becomes the threshold voltage Vth, and the threshold voltage Vth is sampled and stored in the capacitor Cst.

Figure 5:
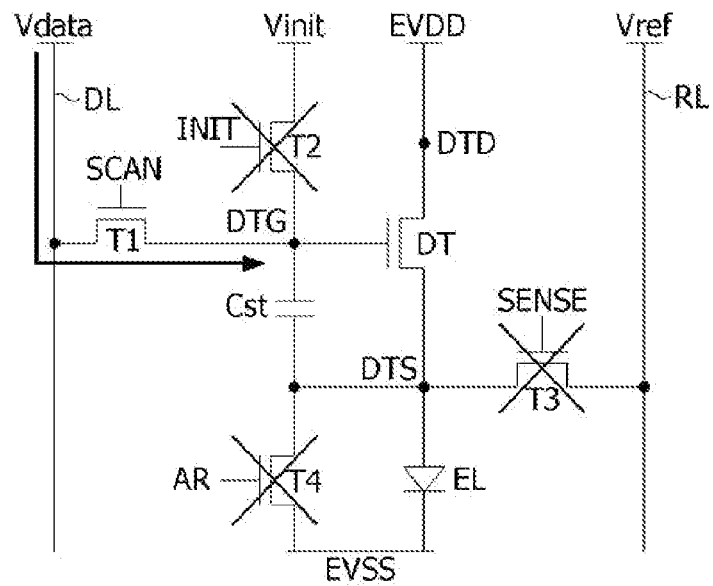
FIG. 5 is a circuit diagram illustrating a data writing period of the pixel circuit shown in FIG. 1 according to the first embodiment of the present disclosure.

In the data writing period Pwr, as shown in FIG. 5, the first switch element T1 is turned on, and the other switch elements T2, T3, and T4 except the first switch element T1 are turned off. In this case, the data voltage Vdata of the pixel data is applied to the second node DTG. In the data writing period Pwr, the voltage of the second node DTG is changed to the data voltage Vdata. At the end of the data writing period Pwr, the voltage Vg of the second node DTG is the data voltage Vdata, and the voltage Vs of the third node DTS has a value of Vinit−Vth. Accordingly, the gate-source voltage Vgs of the driving element DT is changed to a value of Vdata−Vinit+Vth in the data writing period Pwr.

Figure 6:
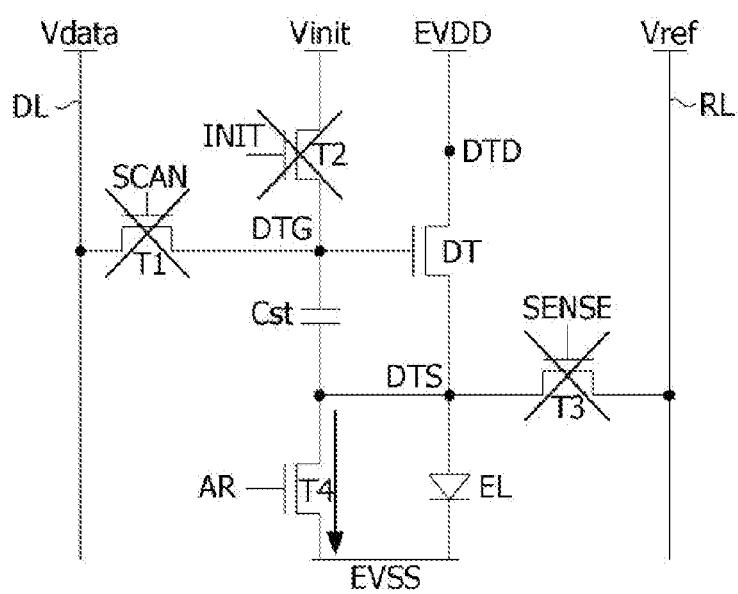
FIG. 6 is a circuit diagram illustrating an anode reset period of the pixel circuit shown in FIG. 1 according to the first embodiment of the present disclosure.

In the anode reset period Par, as shown in FIG. 6, the fourth switch element T4 is turned on, and the other switch elements T1, T2, and T3 except the fourth switch element T4 are turned off. In the anode reset period Par, the voltage Vs of the third node DTS is changed to the pixel reference voltage EVSS, and the voltage Vg of the second node DTG is changed to a value of Vdata−Vinit+Vth+EVSS. The gate-source voltage Vgs of the driving element DT is maintained at a value of Vdata−Vinit+Vth.

Figure 7:
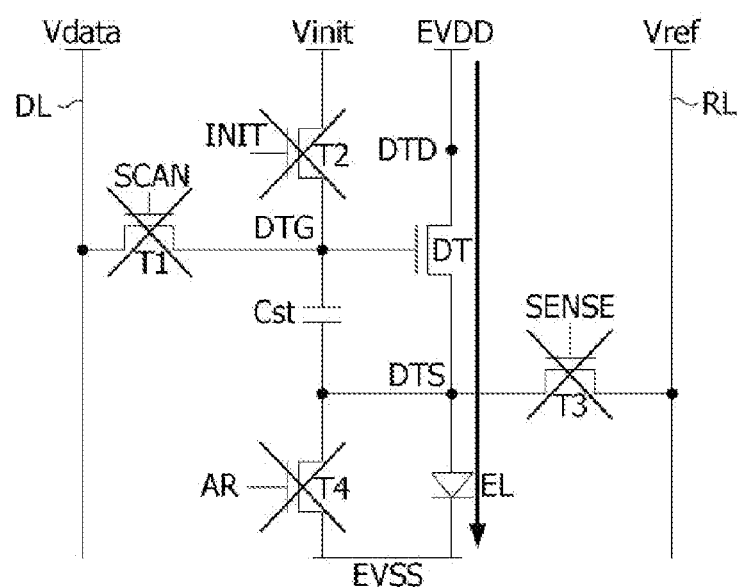
FIG. 7 is a circuit diagram illustrating a boosting period and a light emission period of the pixel circuit shown in FIG. 1 according to the first embodiment of the present disclosure.

In the boosting period Pb, as shown in FIG. 7, all the switch elements T1, T2, T3, and T4 are turned off. At this time, the capacitor of the light emitting element EL is charged. In the boosting period Pb, the second and third nodes DTG and DTS are floated, so that the voltages Vg and Vs of the second and third nodes DTG and DTS increase by a capacitor voltage Voled of the light emitting element EL to be changed to a value of Vdata−Vinit+Vth+EVSS+Voled and a value of EVSS+Voled, respectively. In the boosting period Pb, the gate-source voltage Vgs of the driving element DT is maintained at a value of Vdata−Vinit+Vth. In the light emission period Pem after the boosting period Pb, the light emitting element EL may emit light by a current Iel, which is equal to a value of $K(Vdata-Vth)^2$, generated according to the gate-source voltage Vgs of the driving element DT. Here, "K" is a constant value including the capacitance and mobility of the driving element.

Figure 8:
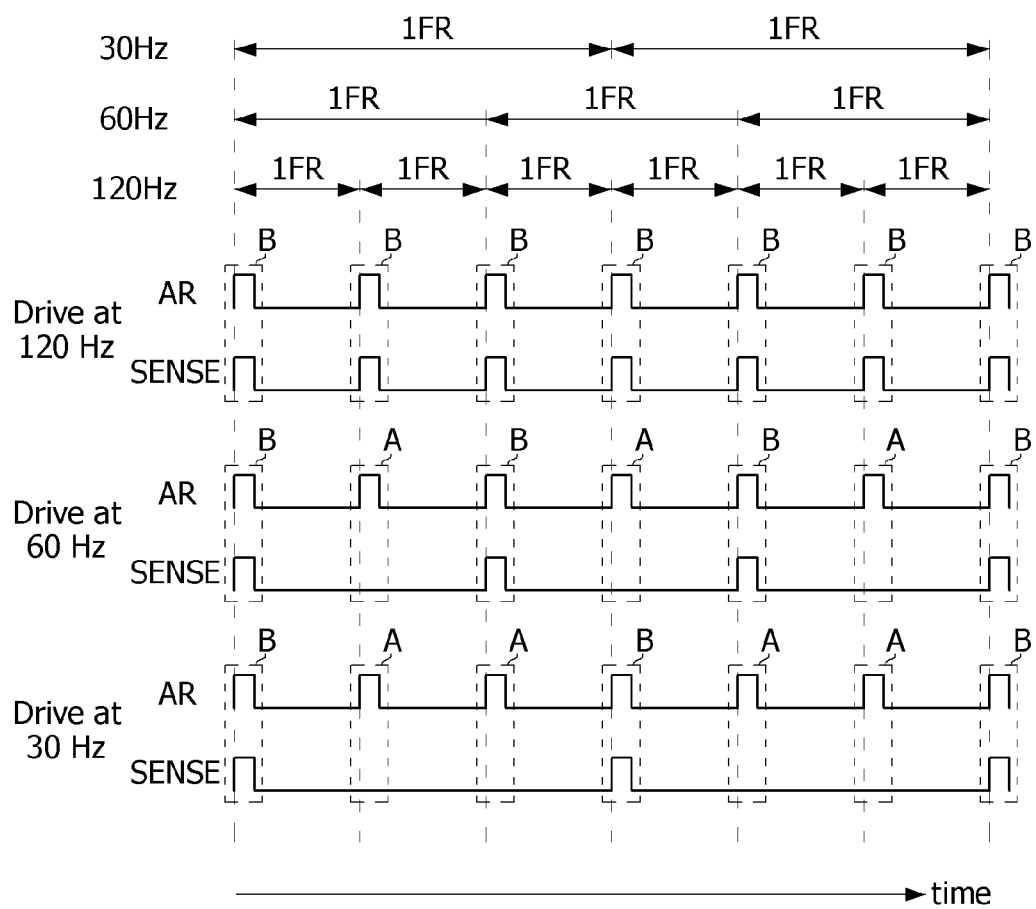
FIG. 8 is a diagram illustrating periods of a sensing pulse and an anode reset pulse applied to the pixel circuit shown in FIG. 1 when a frame frequency is varied according to the first embodiment of the present disclosure.
Figure 30:
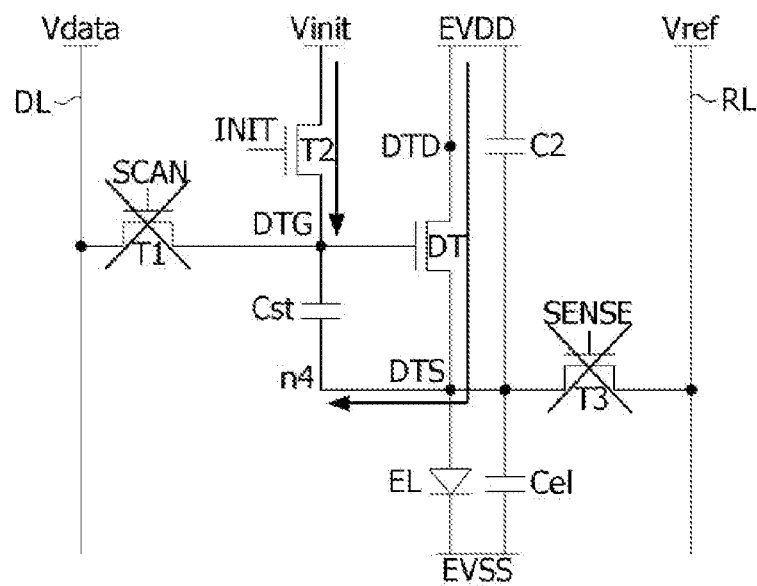
FIG. 30 is a circuit diagram illustrating a sensing period of the pixel circuit shown in FIG. 27 according to the fifth embodiment of the present disclosure.

The frame frequency of the input image may be varied in a wide frequency range, for example, as shown in FIG. 8, to 30 Hz, 60 Hz, and 120 Hz. For example, a timing controller of the display device or a host system may vary the frame frequency according to the movement of the input image or the characteristics of the content. When the frame frequency is reduced, one frame period 1FR during which the pixel data is written and a time period during which the data voltage Vdata is charged into the pixels increases, so that the voltage of the third node DTS is changed. In this case, in the pixels, the gate-source voltage Vgs of the driving element DT is changed, and thus the amount of current supplied to the light emitting element EL is also changed. Accordingly, when the frame frequency is varied, the luminance of the pixels may change resulting in the perception of flicker by a viewer.

In the present disclosure, even if a period during which the pixel data is written into the pixels changes, as shown in FIG. 8, the voltage fluctuations of the third node DTS may be prevented or at least reduced by regularly repeating the anode reset period Par at predetermined time intervals. In the present disclosure, the anode electrode of the light emitting element EL may be connected to the VSS line, which is a power line with the least resistance, in the anode reset step Par, to make the anode voltage and the cathode voltage of the light emitting element EL the same, thereby preventing fluctuations in the anode voltage. In the present disclosure, an anode reset may be performed without additionally connecting a separate anode reset voltage line to the pixel circuit.

FIG. 8 is a diagram illustrating periods of a sensing pulse and an anode reset pulse applied to the pixel circuit shown in FIG. 1 when a frame frequency is varied according to one embodiment. In FIG. 8, the scan pulse SCAN is omitted.

Referring to FIG. 8, the frame frequency may be varied between 30 Hz, 60 Hz, 120 Hz, or the like. Since one frame period 1FR is inversely proportional to the frame frequency, it may be varied according to the frame frequency. The frequency of a data addressing session "B" during which the pixel data is written into the pixels is varied in proportion to the frame frequency. In contrast, the frequency of an anode reset session "A" is controlled to the same frequency, e.g., 120 Hz even if the frame frequency is varied. Even when the frame frequency is changed, the anode reset session A is repeatedly performed at a constant time period to suppress the voltage fluctuations of the third node DRS.

The data addressing session B includes the initialization period Pi, the sensing period Ps, the data writing period Pwr, the anode reset period Par, the boosting period Pb, and the light emission period Pem. Accordingly, in the data addressing session B, all the gate signals SCAN, INIT, SENSE, AR and the data voltage Vdata shown in FIG. 2 are generated.

In the anode reset session A, the anode reset pulse AR is generated at the gate-on voltage VGH and the other gate signals SCAN, INIT, and SENSE are not generated. In other words, in the anode reset session A, the voltages of the first to third gate lines are maintained at the gate-off voltage VGL, and the anode pulse AR is applied to the fourth gate line.

At a frame frequency of 120 Hz, in order to sense the threshold voltage of the driving element DT and write the pixel data to the pixels, the data addressing session B is repeated at 120 Hz, so that the pulses of the gate signals SCAN, INIT, SENSE, and AR as shown in FIG. 2 are supplied to the pixels.

At a frame frequency of 60 Hz, the data addressing session B is repeated at 60 Hz, and the pulses of the gate signals SCAN, INIT, SENSE, and AR as shown in FIG. 2 are supplied to the pixels. In contrast, the anode reset session A is repeated at 120 Hz higher than the frame frequency, and the anode reset pulse AR is supplied to the pixels at that frequency. As a result, while the pixel data is written into the pixels at the frame frequency of 60 Hz, the voltage of the third node DTS is reset to the frequency of 120 Hz, so that the voltage fluctuations of the third node DTS may be suppressed.

At a frame frequency of 30 Hz, the data addressing session B is repeated at 30 Hz, and the pulses of the gate signals SCAN, INIT, SENSE, and AR as shown in FIG. 2 are supplied to the pixels. In contrast, the anode reset session A is repeated at 120 Hz higher than the frame frequency, and the anode reset pulse AR is supplied to the pixels at that frequency. As a result, while the pixel data is written into the pixels at a frame frequency of 30 Hz, the voltage of the third node DTS is reset to a frequency of 120 Hz, so that the voltage fluctuations of the third node DTS may be suppressed.

When the frame frequency of the input image is changed, the frequency of the data addressing session B is changed accordingly. Therefore, the frequencies of the initialization pulse INIT, the sensing pulse SENSE, and the scan pulse SCAN applied to the pixels are changed in proportion to the frame frequency. In contrast, since the anode reset pulse AR is applied constantly to the pixels at a fixed frequency no matter how the frame frequency of the input image is changed, it is possible to prevent variations in luminance of the pixels occurring when the frame frequency is changed.

Figure 9A:
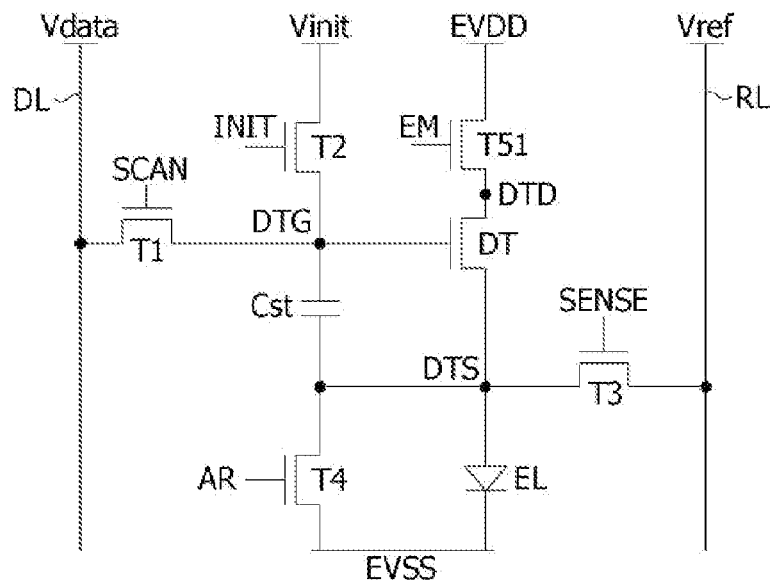
FIGS. 9A and 9B are circuit diagrams illustrating pixel circuits according to a second embodiment of the present disclosure.
Figure 9B:
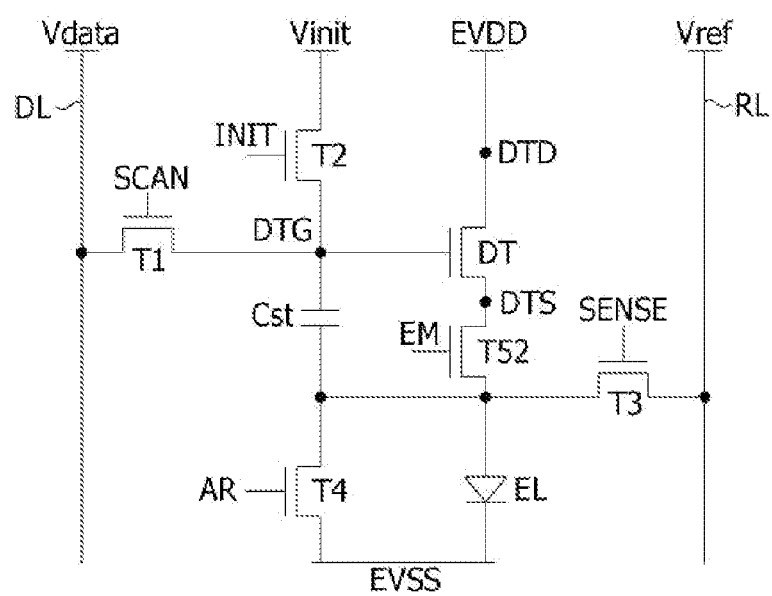
Figure 10:
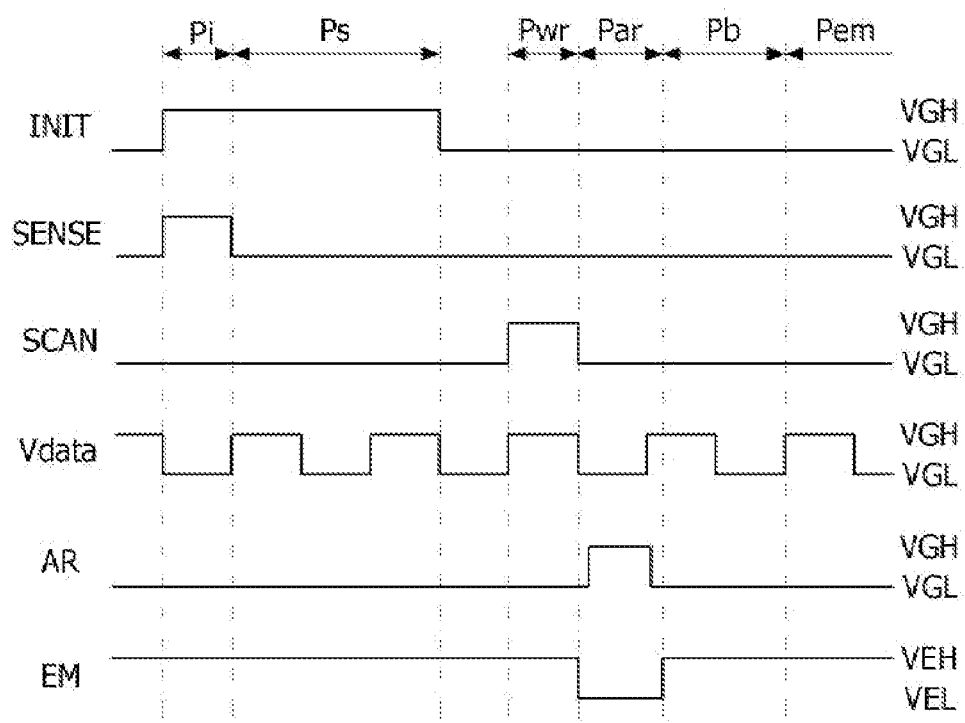
FIG. 10 is a waveform diagram illustrating a gate signal and a data voltage applied to the pixel circuits shown in FIGS. 9A and 9B according to the second embodiment of the present disclosure.
Figure 11A:
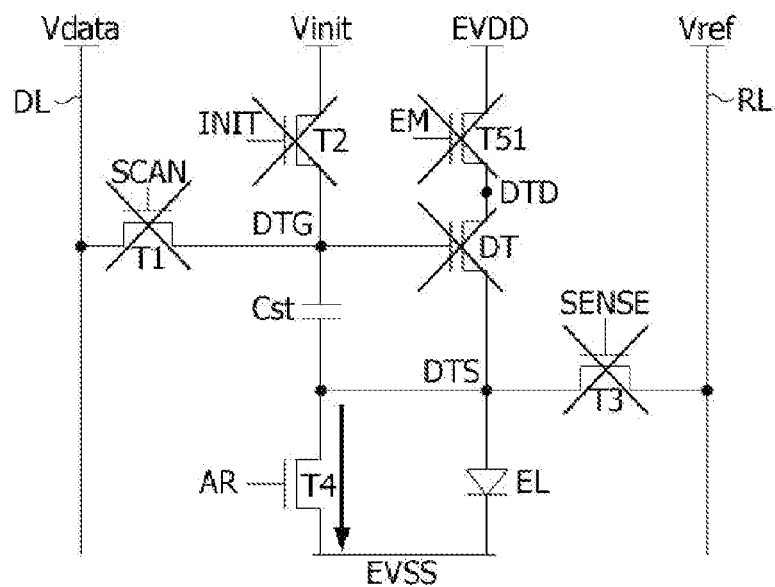
FIGS. 11A and 11B are circuit diagrams illustrating the operations of the pixel circuits shown in FIGS. 9A and 9B in an anode reset period according to the second embodiment of the present disclosure.
Figure 11B:
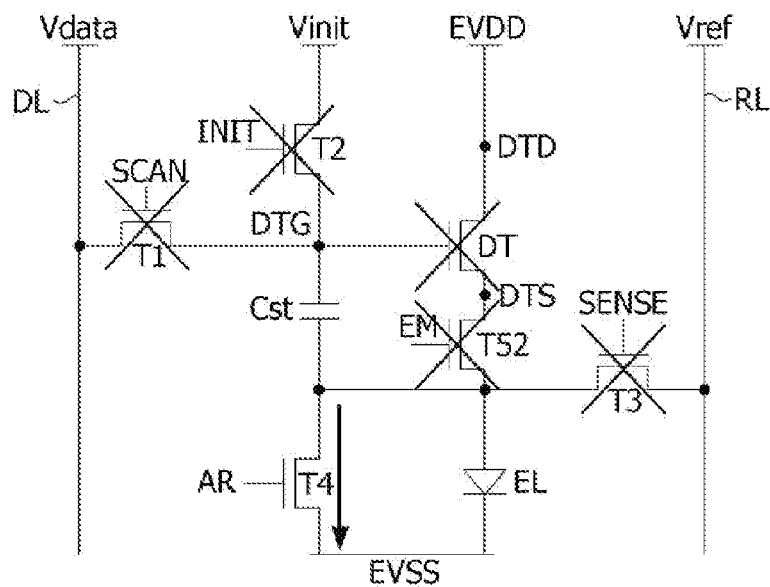

FIGS. 9A and 9B are circuit diagrams illustrating pixel circuits according to a second embodiment of the present disclosure. FIG. 10 is a waveform diagram illustrating a gate signal and a data voltage applied to the pixel circuits shown in FIGS. 9A and 9B according to the second embodiment of the present disclosure. FIG. 11A is a circuit diagram illustrating the operation of the pixel circuit shown in FIG. 9A in the anode reset period Par according to the second embodiment of the present disclosure. FIG. 11B is a circuit diagram illustrating the operation of the pixel circuit shown in FIG. 9B in the anode reset period Par according to the second embodiment of the present disclosure. In this embodiment, the same reference numerals are assigned to the components substantially the same as those of the first embodiment described above, and a detailed description thereof will be omitted.

Referring to FIGS. 9A to 11B, the pixel circuit includes a light emitting element EL, a driving element DT for driving the light emitting element EL, a plurality of switch elements T1 to T52, and a capacitor Cst according to the second embodiment of the present disclosure. The driving element DT and the switch elements T1 to T52 may be implemented with n-channel oxide TFTs, for example. In one embodiment, the switch element T4 may be considered "a second switch."

The pixel circuit is connected to the data line DL through which the data voltage Vdata is applied and the gate lines through which the gate signals SCAN, INIT, SENSE, and AR are applied. In addition, the pixel circuit is connected to the power lines through which DC voltages (or constant voltages) are applied, such as the VDD line through which the pixel driving voltage EVDD is applied, the VSS line through which the pixel reference voltage EVSS is applied, the INIT line through which the initialization voltage Vinit is applied, and the REF line RL through which the reference voltage Vref is applied. The power lines may be commonly connected to all pixels.

The constant voltages, the data voltage, and the voltages VGH and VGL of the gate signals SCAN, INIT, SENSE, and AR applied to the pixel circuit may be set to be the same as in the first embodiment described above. In this embodiment, the gate signal further includes an emission control pulse (hereinafter, referred to as an "EM pulse") EM for controlling fifth switch elements T51 and T52. A gate-on voltage VEH of the EM pulse may be set to be the same as or different from the gate-on voltage VGH of the other gate signals SCAN, INIT, SENSE, and AR. A gate-off voltage VEL of the EM pulse may be set to be the same as or different from the gate-off voltage VEL of the other gate signals SCAN, INIT, SENSE, and AR.

The gate signals SCAN, INIT, SENSE, AR, and EM are generated as pulses swinging between the gate-on voltage VGH, VEH and the gate-off voltage VGL, VEL. The gate driver of the display device may include a first shift register for generating the scan pulse SCAN, a second shift register for generating the initialization pulse INIT, a third shift register for generating the sensing pulse SENSE, a fourth shift register for generating the anode reset pulse AR, and a fifth shift register for generating the EM pulse.

The driving period of the pixel circuit may, as shown in FIG. 10, be divided into an initialization period Pi, a sensing period Ps, a data writing period Pwr, an anode reset period Par, a boosting period Pb, and a light emission period Pem.

In the initialization period Pi, as shown in FIG. 10, the initialization pulse INIT, the sensing pulse SENSE, and the EM pulse EM are generated at the gate-on voltages VGH and VEH. In the initialization period Pi, the scan pulse SCAN and the anode reset pulse AR are at the gate-off voltage VGL.

In the sensing period Ps, as shown in FIG. 10, the initialization pulse INIT and the EM pulse EM are generated at the gate-on voltages VGH and VEH. The sensing pulse SENSE, the scan pulse SCAN, and the anode reset pulse AR are at the gate-off voltage VGL in the sensing period Ps.

In the data writing period Pwr, as shown in FIG. 10, the scan pulse SCAN is generated at the gate-on voltage VGH synchronized with the data voltage Vdata of the pixel data. In the data writing period Pwr, the EM pulse EM is maintained at the gate-on voltage VEH. The initialization pulse INIT, the sensing pulse SENSE, and the anode reset pulse AR are generated at the gate-off voltage VGL in the data writing period Pwr.

In the anode reset period Par, as shown in FIG. 10, the anode reset pulse AR is generated at the gate-on voltage VGH. In the anode reset period Par, the EM pulse is inverted to the gate-off voltage VEL to block a current path between the pixel driving voltage EVDD and the light emitting element EL. The initialization pulse INIT, the sensing pulse SENSE, and the scan pulse SCAN are generated at the gate-off voltage VGL in the anode reset period Par.

In the boosting period Pb and the light emission period Pem, the EM pulse EM is generated at the gate-on voltage VEH, and the other gate signals SCAN, INIT, SENSE, and AR are at the gate-off voltage VGL.

The fifth switch elements T51 and T52 may include, as shown in FIGS. 9A and 9B, at least one of a fifth-first switch element T51 connected between the VDD line through which the pixel driving voltage EVDD is applied and the first node DTD, and a fifth-second switch elements T52 connected between the driving element DT and the light emitting element EL.

The fifth-first switch element T51 supplies the pixel driving voltage EVDD to the first node DTD in response to the gate-on voltage VEH of the EM pulse, and blocks, in the anode reset period Par, a current path between the VDD line and the first node DTD. The fifth-first switch element T51 includes a gate electrode connected to a fifth gate line through which the EM pulse EM is applied, a first electrode connected to the VDD line, and a second electrode connected to the first node DTD.

The fifth-second switch element T52 connects the third node DTS to the anode electrode of the light emitting element EL in response to the gate-on voltage VEH of the EM pulse, and blocks, in the anode reset period Par, a current path between the third node DTS and the anode electrode of the light emitting element EL. The fifth-second switch element T52 includes a gate electrode connected to the fifth gate line through which the EM pulse EM is applied, a first electrode connected to the third node DTS, and a second electrode connected to the anode electrode of the light emitting element EL.

In the initialization period Pi, the second, third and fifth switch elements T2, T3, T51, and T52 and the driving element DT are turned on, and the first and fourth switch elements T1 and T4 are turned off. In this case, the light emitting element EL is not turned on. In the initialization period Pi, the main nodes of the pixel circuit are initialized.

In the sensing period Ps, the second and fifth switch elements T2, T51, and T52 are turned on, while the first, third and fourth switch elements T1, T3, and T4 are turned off. In the sensing period Ps, the gate-source voltage Vgs of the driving element DT reaches the threshold voltage Vth. In the sensing period Ps, the threshold voltage Vth of the driving element DT is sampled and stored in the capacitor Cst.

In the data writing period Pwr, the first and fifth switch elements T1, T51, and T52 are turned on, and the other switch elements T2, T3, and T4 are turned off. In this case, the data voltage Vdata of the pixel data is applied to the second node DTG.

In the anode reset period Par, as shown in FIGS. 11A and 11B, the fourth switch element T4 is turned on, and the other switch elements T1, T2, T3, T51, and T52 are turned off.

In the boosting period Pb, other switch elements T1, T2, T3, and T4 except the fifth switch elements T51 and T52 are turned off. At this time, the capacitor of the light emitting element EL is charged. In the boosting period Pb, the second and third nodes DTG and DTS are floated, so that the voltages Vg and Vs of the second and third nodes DTG and DTS increase by the capacitor voltage Voled of the light emitting element EL. In the light emission period Pem after the boosting period Pb, the light emitting element EL may emit light by a current generated according to the gate-source voltage Vgs of the driving element DT.

Figure 12:
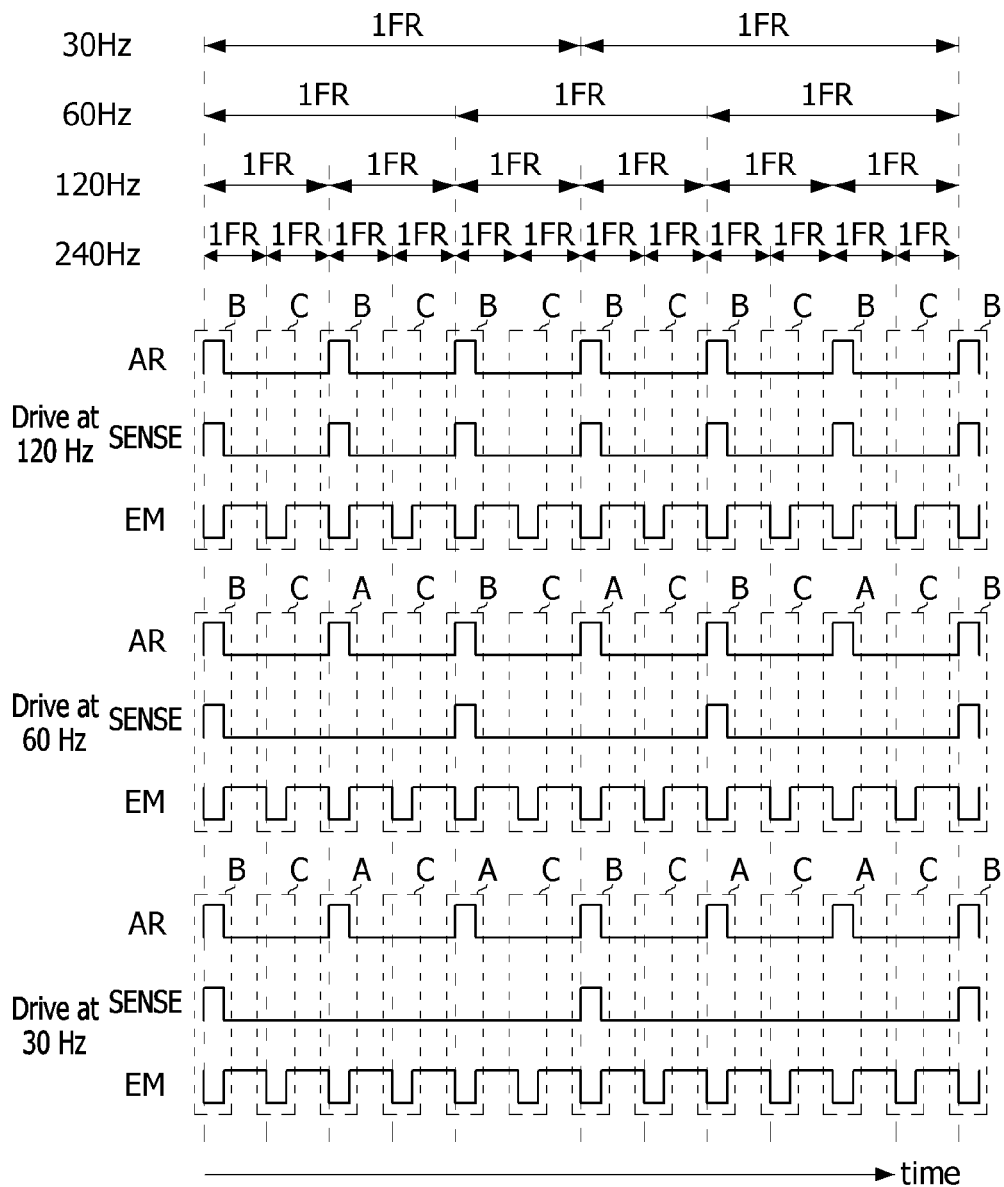
FIG. 12 is a diagram illustrating periods of a sensing pulse and an anode reset pulse applied to the pixel circuits shown in FIGS. 9A and 9B when a frame frequency is varied according to the second embodiment of the present disclosure.

The frame frequency of the input image may be varied in a wide frequency range, for example, as shown in FIG. 12, to 30 Hz, 60 Hz, 120 Hz, and 240 Hz. For example, the timing controller of the display device or the host system may vary the frame frequency according to the movement of the input image or the characteristics of the content. When the frame frequency is reduced, one frame period 1FR during which the pixel data is written and a time period during which the data voltage Vdata is charged into the pixels increase, so that the voltage of the third node DTS is changed. In this case, in the pixels, the gate-source voltage Vgs of the driving element DT is changed, and thus the amount of current supplied to the light emitting element EL is also changed. Accordingly, when the frame frequency is varied, the luminance of the pixels may be changed.

In the present disclosure, even if a period during which the pixel data is written into the pixels changes, as shown in FIG. 12, the voltage fluctuations of the third node DTS may be prevented or at least reduced by regularly repeating the anode reset period Par. In the present disclosure, the anode electrode of the light emitting element EL may be connected to the VSS line, which is a power line with the least resistance, in the anode reset step Par, to make the anode voltage and the cathode voltage of the light emitting element EL the same, thereby preventing or at least reducing fluctuations in the anode voltage. In the present disclosure, an anode reset may be performed without additionally connecting a separate anode reset voltage line to the pixel circuit.

FIG. 12 is a diagram illustrating periods of a sensing pulse and an anode reset pulse applied to the pixel circuits shown in FIGS. 9A and 9B when the frame frequency is varied.

Referring to FIG. 12, the frame frequency may be varied between 30 Hz, 60 Hz, 120 Hz, 240 Hz, or the like. Since one frame period 1FR is inversely proportional to the frame frequency, it may be varied according to the frame frequency. The frequency of the data addressing session B during which the pixel data is written into the pixels is varied in proportion to the frame frequency. In contrast, the frequency of the anode reset session A is controlled to the same frequency, e.g., 120 Hz even if the frame frequency is varied. Even when the frame frequency is changed, the anode reset session A is repeatedly performed at a constant time period to suppress the voltage fluctuations of the third node DRS.

The data addressing session B includes the initialization period Pi, the sensing period Ps, the data writing period Pwr, the anode reset period Par, the boosting period Pb, and the light emission period Pem. Accordingly, all the gate signals SCAN, INIT, SENSE, AR, and EM and the data voltage Vdata shown in FIG. 10 are generated during the data addressing session B.

Figure 13:
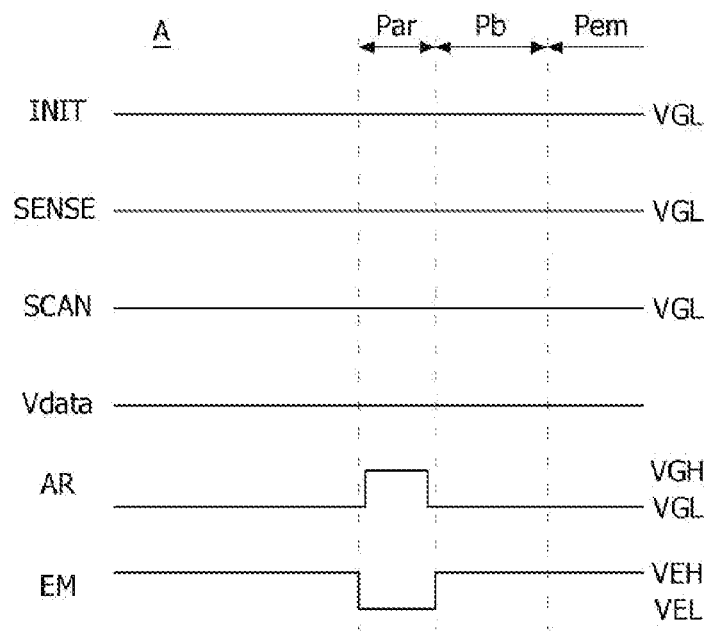
FIG. 13 is a waveform diagram illustrating a gate signal generated in an anode reset session shown in FIG. 12 according to the second embodiment of the present disclosure.

During the anode reset session A, as shown in FIG. 13, the anode reset pulse AR is generated at the gate-on voltage VGH, and the EM pulse EM is generated at the gate-off voltage VEL. During the anode reset session A, the other gate signals SCAN, INIT, and SENSE and the data voltage Vdata of the pixel data are not generated.

Figure 14:
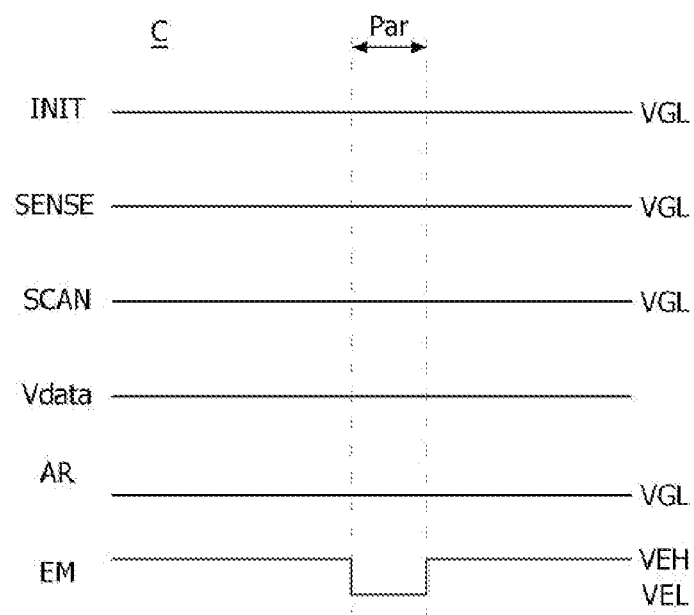
FIG. 14 is a waveform diagram illustrating a gate signal generated in an EM OFF session shown in FIG. 12 according to the second embodiment of the present disclosure.

An EM OFF session "C" during which the fifth switch elements T51 and T52 are turned off without data addressing and anode reset may be set. During the EM OFF session C, as shown in FIG. 14, among the gate signals SCAN, INIT, SENSE, AR, and EM, only the EM pulse EM of the gate-off voltage VEL is generated, and pulses of the other gate signals SCAN, INIT, SENSE, and AR and the data voltage Vdata of the pixel data are not generated. Since the EM pulse EM is generated in the anode reset session A, the data addressing session B, and the EM OFF session C, the frequency of the EM pulse EM may be higher than the frequency of the anode reset pulse AR.

At a frame frequency of 120 Hz, in order to sense the threshold voltage of the driving element DT and write the pixel data to the pixels, the data addressing session B is repeated at 120 Hz, and the pulses of the gate signals SCAN, INIT, SENSE, AR, and EM as shown in FIG. 10 are supplied to the pixels. The EM OFF session C may be set after the data addressing session B. The EM OFF session C may be repeated at 120 Hz at a frame frequency of 120 Hz. Since the EM pulse EM is generated in the data addressing session B and the EM OFF session C, it may be supplied to the pixels at a frequency of 240 Hz.

At a frame frequency of 60 Hz, the data addressing session B is repeated at 60 Hz, and the pulses of the gate signals SCAN, INIT, SENSE, AR, and EM as shown in FIG. 10 are supplied to the pixels. The anode reset session A may be set after the EM OFF session C. The anode reset pulse AR is generated in the anode reset session A and the data addressing session B. As a result, while the pixel data is written into the pixels at the frame frequency of 60 Hz, the voltage of the third node DTS is reset to a frequency of 120 Hz, so that the voltage fluctuations of the third node DTS may be suppressed. The EM OFF session C is allocated between the data addressing session B and the anode reset session A at the frame frequency of 60 Hz. The EM pulse EM may be supplied to the pixels at a frequency of 240 Hz even if the frame frequency is lowered to 60 Hz.

At a frame frequency of 30 Hz, the data addressing session B is repeated at 30 Hz, and the pulses of the gate signals SCAN, INIT, SENSE, AR, and EM as shown in FIG. 10 are supplied to the pixels. The anode reset session A may be set after the EM OFF session C. The anode reset pulse AR is generated in the anode reset session A and the data addressing session B. As a result, while the pixel data is written to the pixels at the frame frequency of 30 Hz, the voltage of the third node DTS is reset to a frequency of 120 Hz, so that the voltage fluctuations of the third node DTS may be suppressed. The EM OFF session C is allocated between the data addressing session B and the anode reset session A at a frame frequency of 30 Hz. The EM pulse EM may be supplied to the pixels at a frequency of 240 Hz even if the frame frequency is lowered to 60 Hz.

Therefore, according to the present disclosure, since the anode reset pulse AR is applied to the pixels at the same frequency no matter how the frame frequency is changed, it is possible to prevent or at least reduce the luminance variation of the pixels occurring when the frame frequency is changed.

Figure 15:
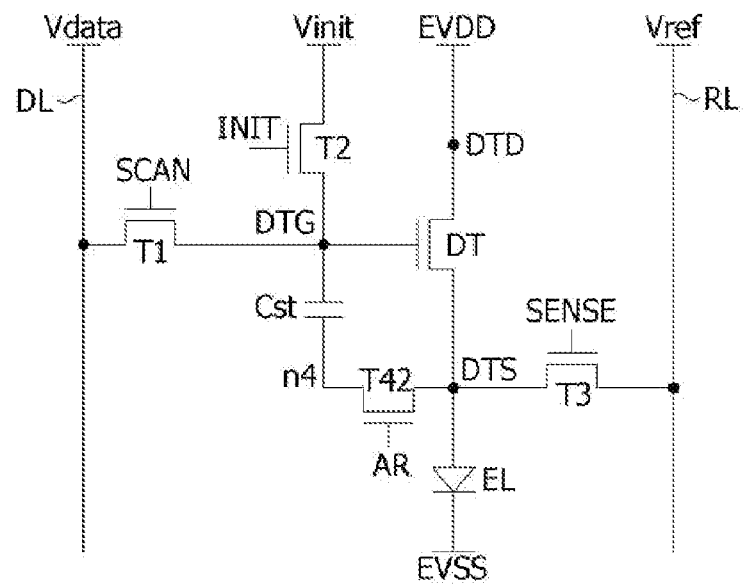
FIG. 15 is a circuit diagram illustrating a pixel circuit according to a third embodiment of the present disclosure.
Figure 16:
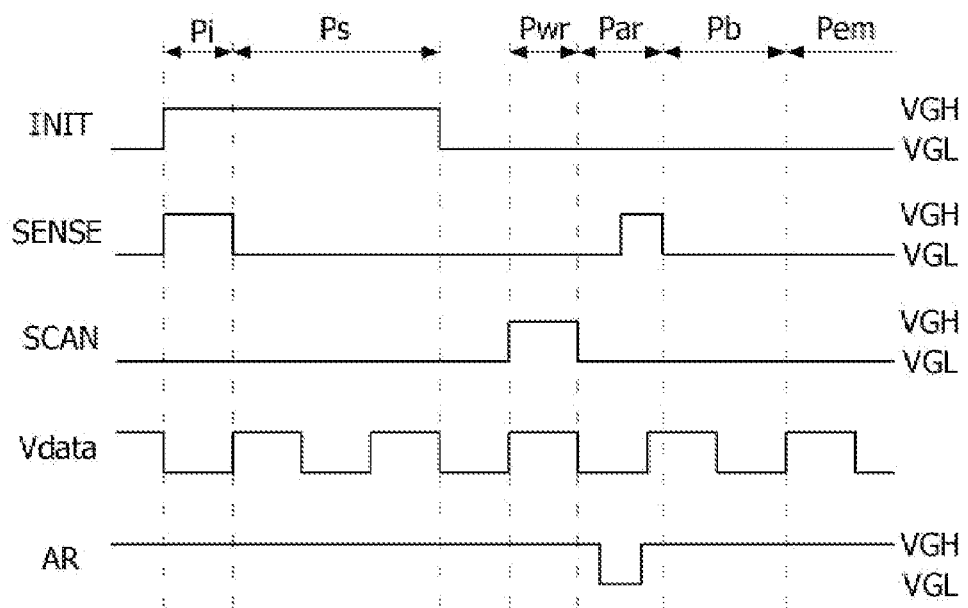
FIG. 16 is a waveform diagram illustrating a gate signal and a data voltage applied to the pixel circuit shown in FIG. 15 according to the third embodiment of the present disclosure.

FIG. 15 is a circuit diagram illustrating a pixel circuit according to a third embodiment of the present disclosure. FIG. 16 is a waveform diagram illustrating a gate signal and a data voltage applied to the pixel circuit shown in FIG. 15 according to the third embodiment of the present disclosure. FIGS. 17 to 21 are diagrams illustrating the operation of the pixel circuit shown in FIG. 15 in stages according to the third embodiment of the present disclosure. In this embodiment, the same reference numerals are assigned to the components substantially the same as those of the above-described embodiments, and a detailed description thereof will be omitted. In one embodiment, the switch element T3 may be considered "a second switch."

Referring to FIGS. 15 to 21, the pixel circuit includes a light emitting element EL, a driving element DT for driving the light emitting element EL, a plurality of switch elements T1 to T42, and a capacitor Cst according to the third embodiment of the present disclosure. The driving element DT and the switch elements T1 to T42 may be implemented with n-channel oxide TFTs, for example.

The pixel circuit is connected to the data line DL through which the data voltage Vdata is applied, and the gate lines through which the gate signals SCAN, INIT, SENSE, and AR are applied. In addition, the pixel circuit is connected to the power lines through which DC voltages (or constant voltages) are applied, such as the VDD line through which the pixel driving voltage EVDD is applied, the VSS line through which the pixel reference voltage EVSS is applied, the INIT line through which the initialization voltage Vinit is applied, and the REF line RL through which the reference voltage Vref is applied. The power lines may be commonly connected to all pixels.

The constant voltages, the data voltage, and the voltages VGH and VGL of the gate signals SCAN, INIT, SENSE, and AR applied to the pixel circuit may be set to be the same as in the above-described embodiments.

The gate signals SCAN, INIT, SENSE, and AR are generated as pulses swinging between the gate-on voltage VGH and the gate-off voltage VGL. The gate driver of the display device may include a first shift register for generating the scan pulse SCAN, a second shift register for generating the initialization pulse INIT, a third shift register for generating the sensing pulse SENSE, and a fourth shift register for generating the anode reset pulse AR.

As shown in FIG. 16, the driving period of the pixel circuit may be divided into an initialization period Pi, a sensing period Ps, a data writing period Pwr, an anode reset period Par, a boosting period Pb, and a light emission period Pem.

In the initialization period Pi, as shown in FIG. 16, the initialization pulse INIT, the sensing pulse SENSE, and the anode reset pulse AR are generated at the gate-on voltage VGH. In the initialization period Pi, the scan pulse SCAN is at the gate-off voltage VGL.

In the sensing period Ps, as shown in FIG. 16, the initialization pulse INIT and the anode reset pulse AR are generated at the gate-on voltage VGH. The sensing pulse SENSE and the scan pulse SCAN are at the gate-off voltage VGL in the sensing period Ps.

In the data writing period Pwr, as shown in FIG. 16, the scan pulse SCAN is generated at the gate-on voltage VGH synchronized with the data voltage Vdata of the pixel data. In the data writing period Pwr, the anode reset pulse AR is maintained at the gate-on voltage VGH. The initialization pulse INIT and the sensing pulse SENSE are generated at the gate-off voltage VGL in the data writing period Pwr.

In the anode reset period Par, as shown in FIG. 16, the sensing pulse SENSE is generated at the gate-on voltage VGH, and the anode reset pulse AR is generated at the gate-off voltage VGL. In the anode reset period Par, the initialization pulse INIT and the scan pulse SCAN are at the gate-off voltage VGL. A falling timing at which the anode reset pulse AR changes from the gate-on voltage VGH to the gate-off voltage VGL may be ahead of a rising timing at which the sensing pulse SENSE changes from the gate-off voltage VGL to the gate-on voltage VGH. In addition, a rising timing at which the anode reset pulse AR changes from the gate-off voltage VGL to the gate-on voltage VGH may be ahead of a falling timing at which the sensing pulse SENSE changes from the gate-on voltage VGH to the gate-off voltage VGL.

In the boosting period Pb and the light emission period Pem, the anode reset pulse AR is generated at the gate-on voltage VGH, and the other gate signals SCAN, INIT, and SENSE are at the gate-off voltage VGL.

In this pixel circuit, the capacitor Cst for storing the gate-source voltage Vgs of the driving element is connected between the second node DTG and a fourth node n4.

A fourth switch element T42 connect the capacitor Cst to the third node DTS in response to the gate-on voltage VGH of the anode reset pulse AR in the initialization period Pi, the sensing period Ps, the data writing period Pwr, the boosting period Pwr, and the light emission period Pem. The fourth switch element T42 is turned off in response to the gate-off voltage VGL of the anode reset pulse AR in the anode reset step Par to block a current path between the capacitor Cst and the third node DTS. The fourth switch element T42 includes a gate electrode connected to the fifth gate line through which the anode reset pulse AR is applied, a first electrode connected to the fourth node n4, and a second electrode connected to the third node DTS.

Figure 17:
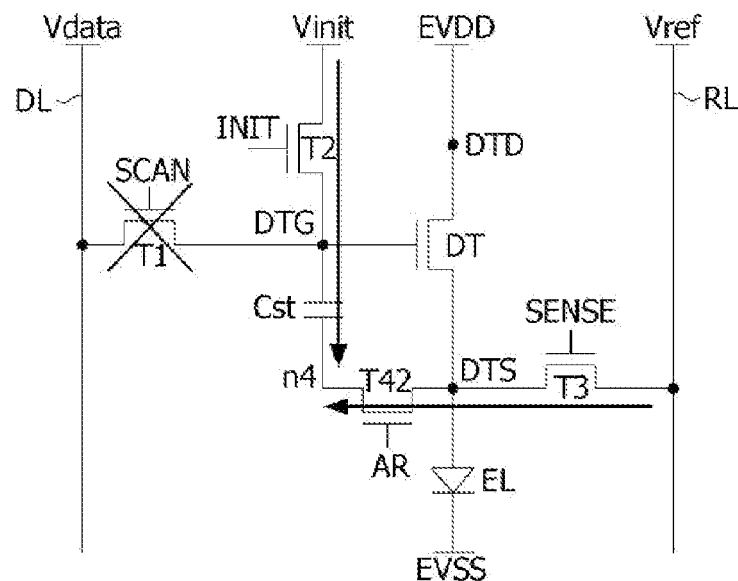
FIG. 17 is a circuit diagram illustrating an initialization period of the pixel circuit shown in FIG. 15 according to a third embodiment of the present disclosure.

In the initialization period Pi, as shown in FIG. 17, the second, third, and fourth switch elements T2, T3, and T42 and the driving element DT are turned on, and the first switch element T1 is turned off. In this case, the light emitting element EL is not turned on. In the initialization period Pi, the main nodes of the pixel circuit are initialized. In the initialization period Pi, the voltage Vg of the second node DTG is the initialization voltage Vinit, and the voltage Vs of the third node DTS is the reference voltage Vref. Accordingly, in the initialization period Pi, the gate-source voltage Vgs of the driving element DT has a value of Vinit-Vref.

Figure 18:
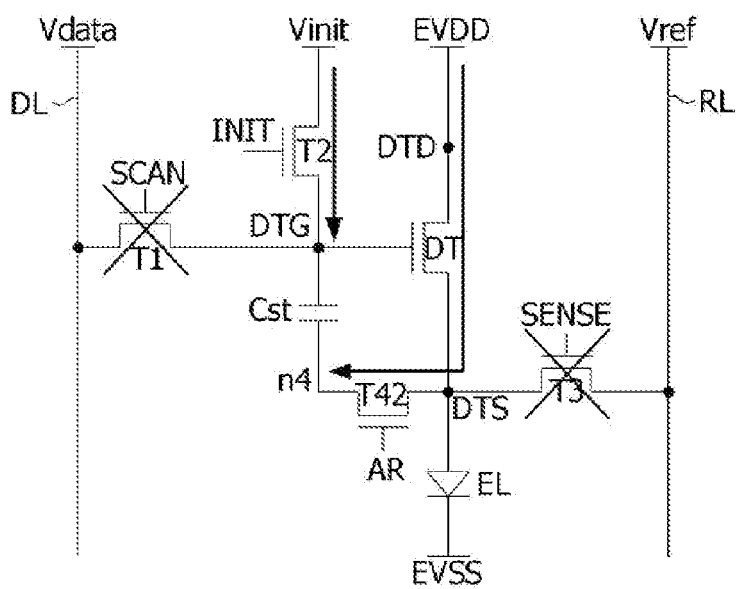
FIG. 18 is a circuit diagram illustrating a sensing period of the pixel circuit shown in FIG. 15 according to a third embodiment of the present disclosure.

In the sensing period Ps, as shown in FIG. 18, the second and fourth switch elements T2 and T42 are turned on, while the first and third switch elements T1 and T3 are turned off. In the sensing period Ps, the gate-source voltage Vgs of the driving element DT reaches the threshold voltage Vth. In the sensing period Ps, the voltage Vs of the third node DTS is changed to a value of Vinit-Vth. Accordingly, at the end of the sensing period Ps, the gate-source voltage Vgs of the driving element DT becomes the threshold voltage Vth, and the threshold voltage Vth is sampled and stored in the capacitor Cst.

Figure 19:
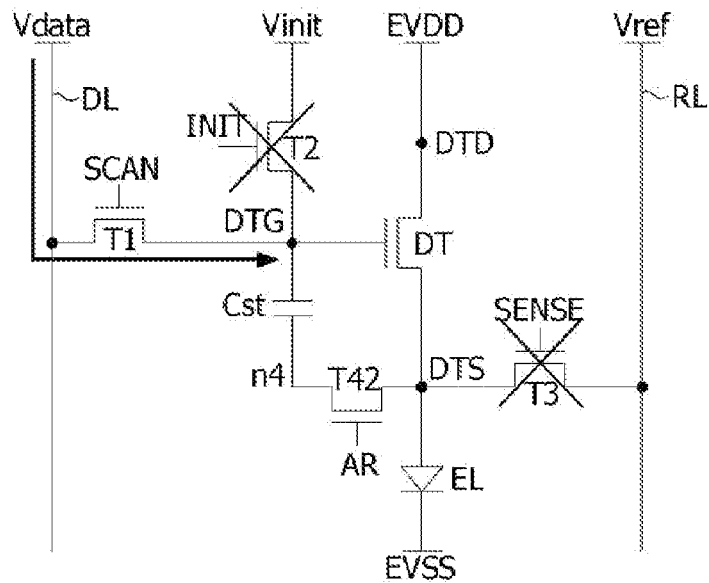
FIG. 19 is a circuit diagram illustrating a data writing period of the pixel circuit shown in FIG. 15 according to a third embodiment of the present disclosure.

In the data writing period Pwr, as shown in FIG. 19, the first and fourth switch elements T1 and T42 are turned on, and the other switch elements T2 and T3 are turned off. In this case, the data voltage Vdata of the pixel data is applied to the second node DTG. In the data writing period Pwr, the voltage of the second node DTG is changed to the data voltage Vdata. At the end of the data writing period Pwr, the voltage Vg of the second node DTG is the data voltage Vdata, and the voltage Vs of the third node DTS has a value of Vinit-Vth. Accordingly, the gate-source voltage Vgs of the driving element DT is changed to a value of Vdata-Vinit+Vth in the data writing period Pwr.

Figure 20:
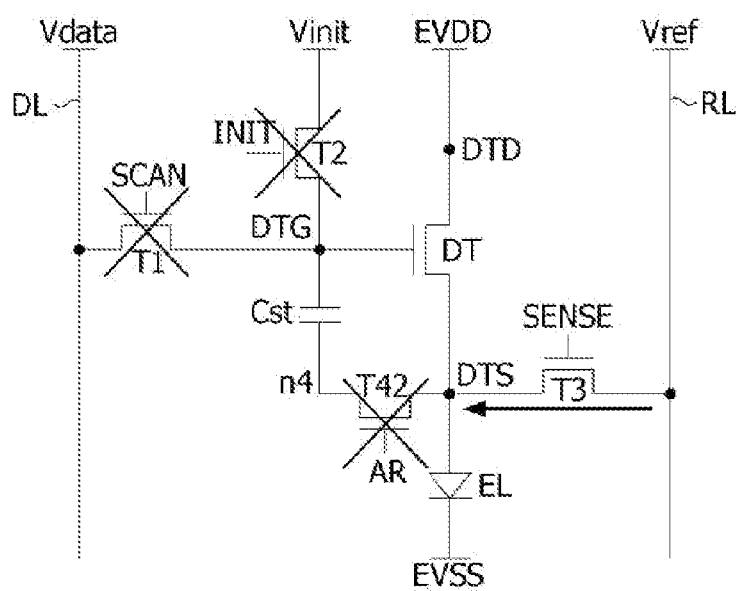
FIG. 20 is a circuit diagram illustrating an anode reset period of the pixel circuit shown in FIG. 15 according to a third embodiment of the present disclosure.

In the anode reset period Par, as shown in FIG. 20, the third switch element T3 is turned on, and the other switch elements T1, T2 and T42 are turned off. In this case, the third node DTS is reset to the reference voltage Vref. In the anode reset period Par, the voltage Vs of the third node DTS is changed to the reference voltage Vref, and the voltage Vg of the second node DTG is changed to a value of Vdata-Vinit+Vth+Vref. The gate-source voltage Vgs of the driving element DT is maintained at a value of Vdata-Vinit+Vth.

Figure 21:
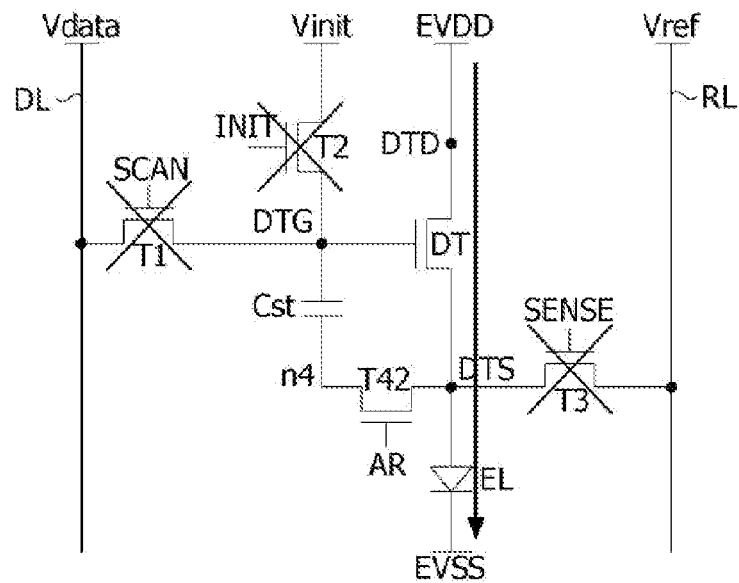
FIG. 21 is a circuit diagram illustrating a boosting period and a light emission period of the pixel circuit shown in FIG. 15 according to a third embodiment of the present disclosure.

In the boosting period Pb, other switch elements T1, T2, and T3 except for the fourth switch element T42 are turned off. In this case, the capacitor of the light emitting element EL is charged. In the boosting period Pb, the second and third nodes DTG and DTS are floated, so that the voltages Vg and Vs of the second and third nodes DTG and DTS increase by the capacitor voltage Voled of the light emitting element EL to be changed to a value of Vdata-Vinit+Vth+Vref+Voled and a value of Vref+Voled, respectively. In the boosting period Pb, the gate-source voltage Vgs of the driving element DT is maintained at a value of Vdata-Vinit+Vth. In the light emission period Pem after the boosting period Pb, as shown in FIG. 21, the light emitting element EL may emit light by a current generated according to the gate-source voltage Vgs of the driving element DT.

In this embodiment, the frame frequency of the input image may be varied in a wide frequency range, for example, as shown in FIG. 8, to 30 Hz, 60 Hz, and 120 Hz. For example, the timing controller of the display device or the host system may vary the frame frequency according to the movement of the input image or the characteristics of the content. When the frame frequency is lowered, one frame period 1FR during which the pixel data is written and a time period during which the data voltage Vdata is charged into the pixels increase, so that the voltage of the third node DTS is changed. In this case, in the pixels, the gate-source voltage Vgs of the driving element DT is changed, and thus the amount of current supplied to the light emitting element EL is also changed. Accordingly, when the frame frequency is varied, the luminance of the pixels may be changed.

When the frame frequency of the input image is varied, the pixel circuit shown in FIG. 15 may be driven as shown in FIG. 8. As can be seen from the anode reset session A shown in FIG. 8, even if a period during which the pixel data is written into the pixels changes, the pixel circuit shown in FIG. 15 may regularly repeat the anode reset step Par to prevent or at least reduce the voltage fluctuations of the third node DTS. In the present disclosure, by resetting the voltage of the third node DTS and the anode voltage of the light emitting element EL to the reference voltage Vref in the anode reset period Par, it is possible to prevent or at least reduce fluctuations in the anode voltage. In the present disclosure, an anode reset can be performed without additionally connecting a separate anode reset voltage line to the pixel circuit.

Figure 22A:
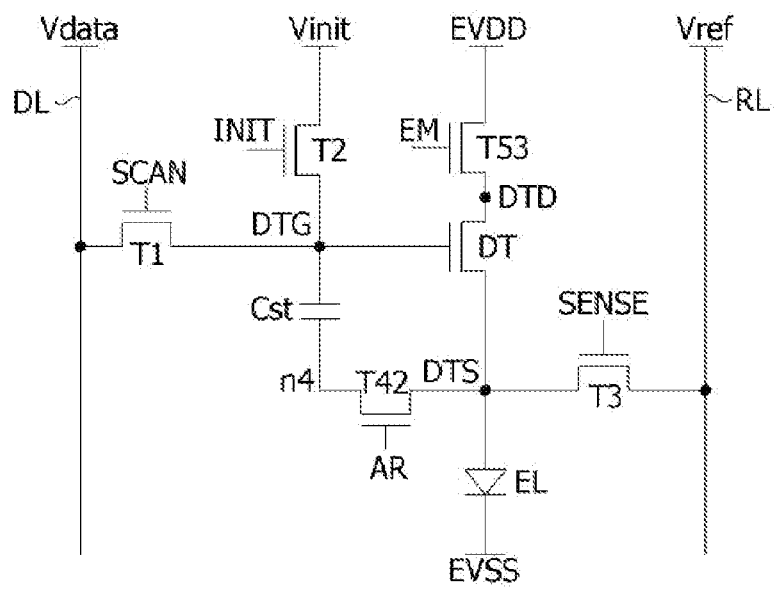
FIGS. 22A and 22B are circuit diagrams illustrating pixel circuits according to a fourth embodiment of the present disclosure.
Figure 22B:
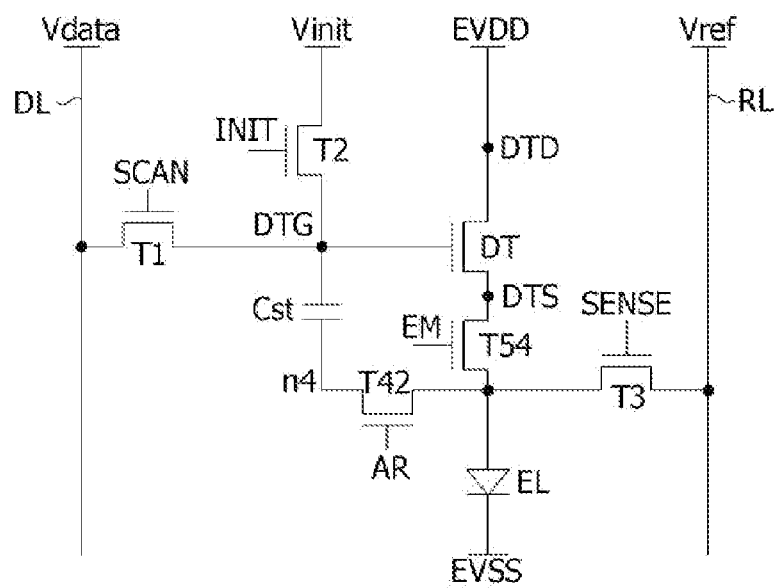
Figure 23:
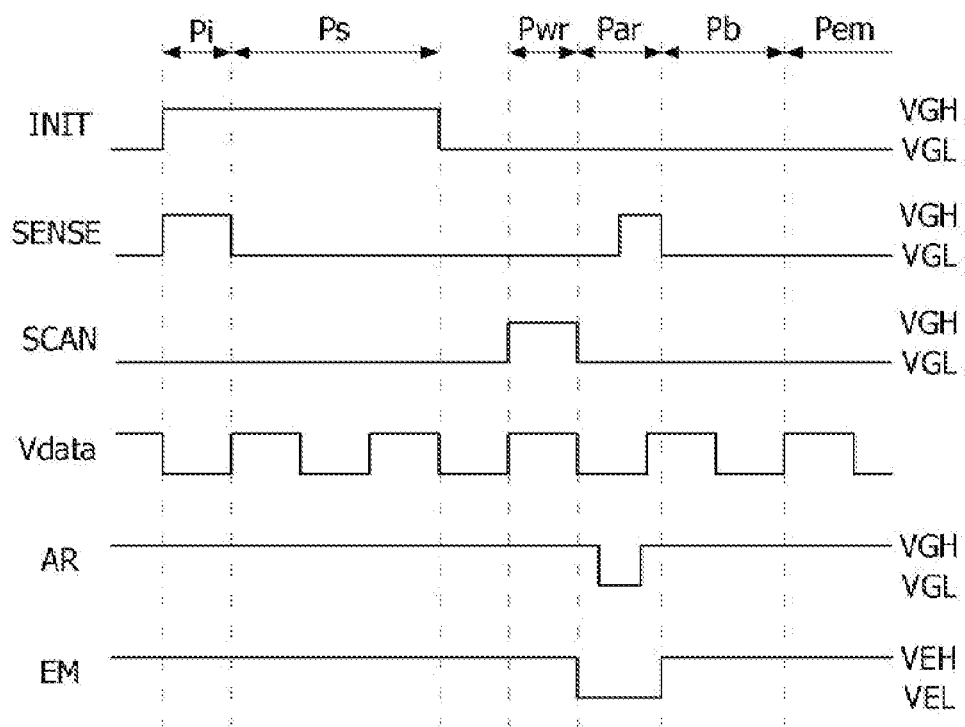
FIG. 23 is a waveform diagram illustrating a gate signal and a data voltage applied to the pixel circuits shown in FIGS. 22A and 22B according to the fourth embodiment of the present disclosure.
Figure 24A:
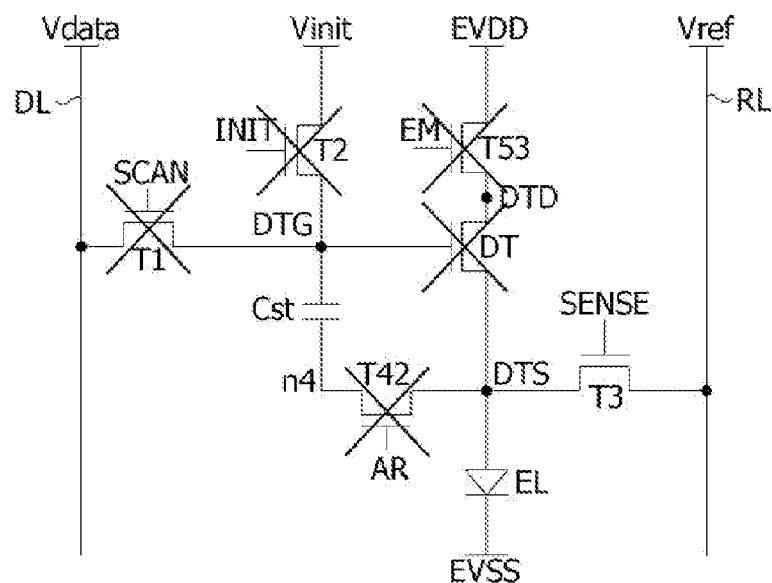
FIGS. 24A and 24B are circuit diagrams illustrating the operations of the pixel circuits shown in FIGS. 22A and 22B in an anode reset period according to the fourth embodiment of the present disclosure.
Figure 24B:
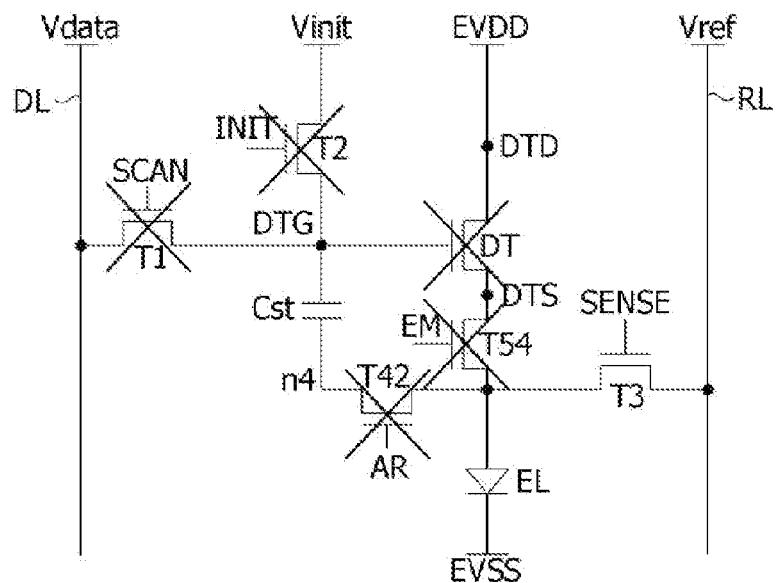

FIGS. 22A and 22B are circuit diagrams illustrating pixel circuits according to a fourth embodiment of the present disclosure. FIG. 23 is a waveform diagram illustrating a gate signal and a data voltage applied to the pixel circuits shown in FIGS. 22A and 22B according to the fourth embodiment of the present disclosure. FIGS. 24A and 24B are circuit diagrams illustrating the operations of the pixel circuits shown in FIGS. 22A and 22B in an anode reset period according to the fourth embodiment of the present disclosure. In FIGS. 22A to 24B, a detailed description of the components substantially the same as those of the above-described embodiments will be omitted.

Referring to FIGS. 22A to 24B, the pixel circuit includes a light emitting element EL, a driving element DT for driving the light emitting element EL, a plurality of switch elements T1 to T54, and a capacitor Cst according to the fourth embodiment of the present disclosure. The driving element DT and the switch elements T1 to T54 may be implemented with n-channel oxide TFTs, for example. In one embodiment, the switch element T3 may be considered "a second switch."

The constant voltages, the data voltage, and the voltages VGH and VGL of the gate signals SCAN, INIT, SENSE, and AR applied to the pixel circuit may be set to be the same as in the above-described embodiments.

The gate signals SCAN, INIT, SENSE, AR, and EM are generated as pulses swinging between the gate-on voltage VGH, VEH and the gate-off voltage VGL, VEL. The gate driver of the display device may include a first shift register for generating the scan pulse SCAN, a second shift register for generating the initialization pulse INIT, a third shift register for generating the sensing pulse SENSE, a fourth shift register for generating the anode reset pulse AR, and a fifth shift register for generating the EM pulse EM.

As shown in FIG. 23, the driving period of the pixel circuit may be divided into an initialization period Pi, a sensing period Ps, a data writing period Pwr, an anode reset period Par, a boosting period Pb, and a light emission period Pem.

In the initialization period Pi, as shown in FIG. 23, the initialization pulse INIT, the sensing pulse SENSE, the anode reset pulse AR, and the EM pulse EM are generated at the gate-on voltages VGH and VEH. In the initialization period Pi, the scan pulse SCAN is at the gate-off voltage VGL.

In the sensing period Ps, as shown in FIG. 23, the initialization pulse INIT, the anode reset pulse AR, and the EM pulse EM are generated at the gate-on voltages VGH and VEH. The sensing pulse SENSE and the scan pulse SCAN are at the gate-off voltages VGL in the sensing period Ps.

In the data writing period Pwr, as shown in FIG. 23, the scan pulse SCAN is generated at the gate-on voltage VGH synchronized with the data voltage Vdata of the pixel data. In the data writing period Pwr, the anode reset pulse AR and the EM pulse EM are maintained at the gate-on voltage VEH. The initialization pulse INIT and the sensing pulse SENSE are generated at the gate-off voltage VGL in the data writing period Pwr.

In the anode reset period Par, as shown in FIG. 23, the sensing pulse SENSE is generated at the gate-on voltage VGH. In the anode reset period Par, the anode reset pulse AR and the EM pulse EM are inverted to the gate-off voltages VGL and VEL respectively. The initialization pulse INIT and the scan pulse SCAN are generated at the gate-off voltage VGL in the anode reset period Par.

In the boosting period Pb and the light emission period Pem, the anode reset pulse AR and the EM pulse EM are generated at the gate-on voltages VGH and VEH respectively, and the other gate signals SCAN, INIT, and SENSE are at the gate-off voltage VGL.

Fifth switch elements T53 and T54 may include, as shown in FIGS. 22A and 22B, at least one of a fifth-first switch element T53 connected between the VDD line through which the pixel driving voltage EVDD is applied and the first node DTD, and a fifth-second switch element T54 connected between the driving element DT and the light emitting element EL.

The fifth-first switch element T53 includes a gate electrode connected to the fifth gate line through which the EM pulse EM is applied, a first electrode connected to the VDD line, and a second electrode connected to the first node DTD. The fifth-second switch element T52 includes a gate electrode connected to the fifth gate line through which the EM pulse EM is applied, a first electrode connected to the third node DTS, and a second electrode connected to the anode electrode of the light emitting element EL.

In the initialization period Pi, the second, third, fourth, and fifth switch elements T2, T3, T42, T53, and T54 and the driving element DT are turned on, and the first switch element T1 is turned off. In this case, the light emitting element EL is not turned on. In the initialization period Pi, the main nodes of the pixel circuit are initialized.

In the sensing period Ps, the second, fourth, and fifth switch elements T2, T42, T53, and T54 are turned on, while the first and third switch elements T1 and T3 are turned off. In the sensing period Ps, the gate-source voltage Vgs of the driving element DT reaches the threshold voltage Vth. In the sensing period Ps, the threshold voltage Vth of the driving element DT is sampled and stored in the capacitor Cst.

In the data writing period Pwr, the first, fourth, and fifth switch elements T1, T42, T53, and T54 are turned on, and the other switch elements T2 and T3 are turned off. In this case, the data voltage Vdata of the pixel data is applied to the second node DTG.

In the anode reset period Par, as shown in FIGS. 24A and 24B, the third switch element T3 is turned on, and the other switch elements T1, T2, T42, T53, and T54 are turned off.

In the boosting period Pb, other switch elements T1, T2, and T3 except for the fourth and fifth switch elements T42, T53, and T54 are turned off. In this case, the capacitor of the light emitting element EL is charged. In the boosting period Pb, the second and third nodes DTG and DTS are floated, so that the voltages Vg and Vs of the second and third nodes DTG and DTS increase by the capacitor voltage Voled of the light emitting element EL. In the light emission period Pem after the boosting period Pb, the light emitting element EL may emit light by a current generated according to the gate-source voltage Vgs of the driving element DT.

When the frame frequency of the input image is varied, the pixel circuits shown in FIGS. 22A and 22B may be driven as shown in FIG. 12.

The frame frequency of the input image may be varied in a wide frequency range, for example, as shown in FIG. 12, to 30 Hz, 60 Hz, 120 Hz, and 240 Hz. As can be seen from the anode reset session A shown in FIG. 12, even if a period during which the pixel data is written into the pixels is changed, the voltage fluctuations of the third node DTS may be prevented by regularly repeating the anode reset step Par. In the present disclosure, an anode reset may be performed without additionally connecting a separate anode reset voltage line to the pixel circuit.

Figure 25:
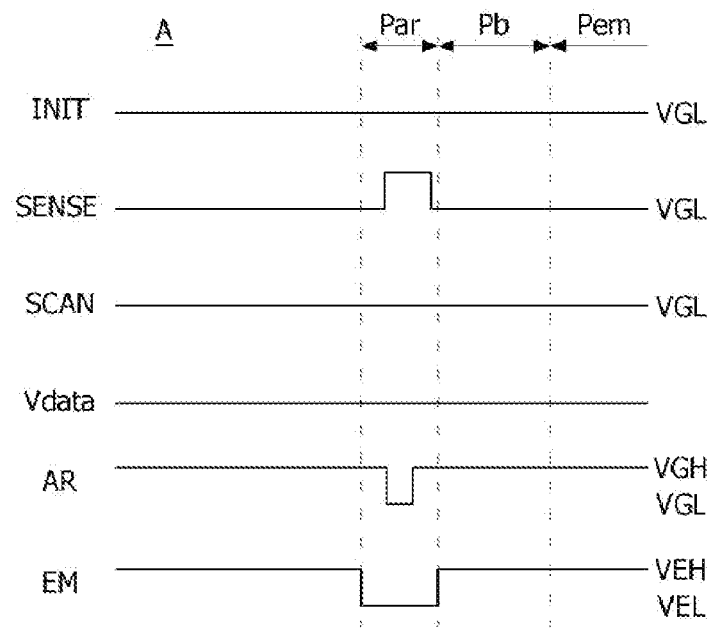
FIG. 25 is a waveform diagram illustrating a gate signal supplied to the pixel circuits shown in FIGS. 22A and 22B during an anode reset session when a frame frequency of an input image is varied as shown in FIG. 12 according to the fourth embodiment of the present disclosure.

During the anode reset session A, as shown in FIG. 25, the sensing pulse SENSE is generated at the gate-on voltage VGH, and the anode reset pulse AR and EM pulse EM are inverted to the gate-off voltages VGL and VEL respectively. During the anode reset session A, the other gate signals SCAN and INIT and the data voltage Vdata of the pixel data are not generated. Therefore, in the present disclosure, since the anode reset pulse AR is applied to the pixels at the same frequency no matter how the frame frequency is changed, it is possible to prevent the luminance variation of the pixels occurring when the frame frequency is changed.

Figure 26:
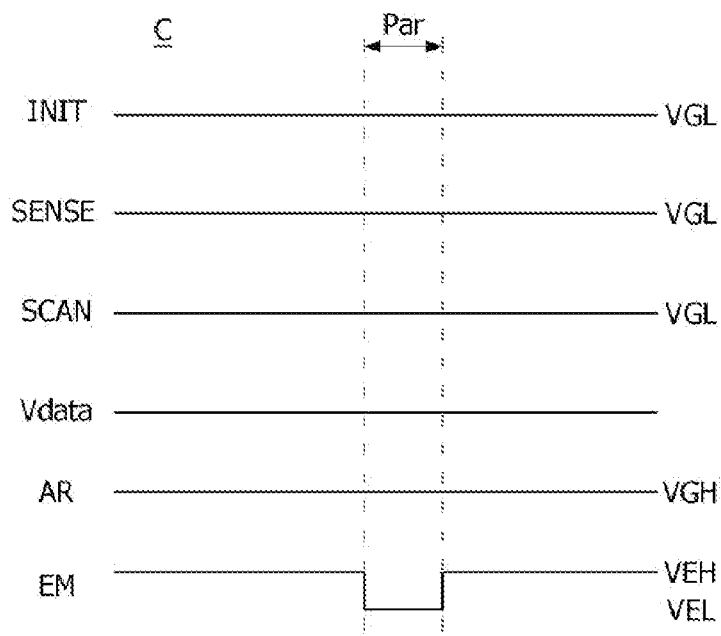
FIG. 26 is a waveform diagram illustrating a gate signal supplied to the pixel circuits shown in FIGS. 22A and 22B during an EM OFF session when a frame frequency of an input image is varied as shown in FIG. 12 according to the fourth embodiment of the present disclosure.

During the EM OFF session C, as shown in FIG. 26, the anode reset pulse AR is generated at the gate-on voltage VGH. During the EM OFF session C, the pulses of the other gate signals SCAN, INIT, SENSE and EM, and the data voltage Vdata of the pixel data are not generated.

Figure 27:
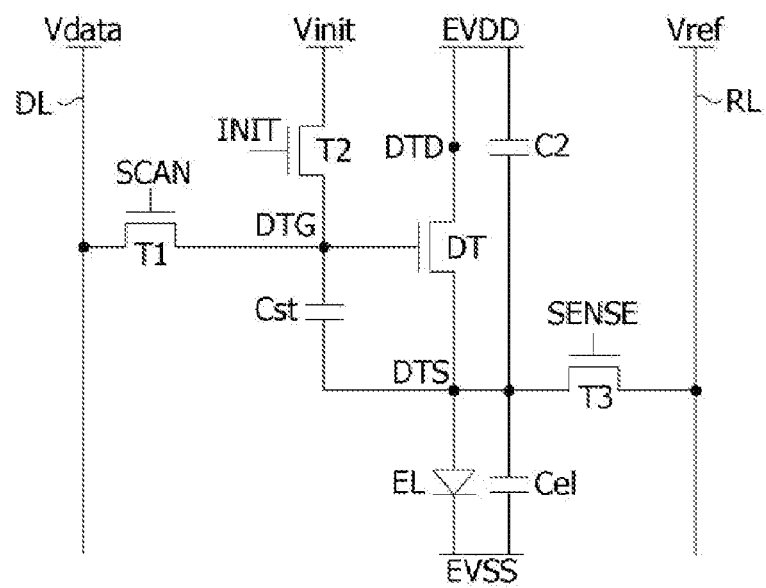
FIG. 27 is a circuit diagram illustrating a pixel circuit according to a fifth embodiment of the present disclosure.
Figure 28:
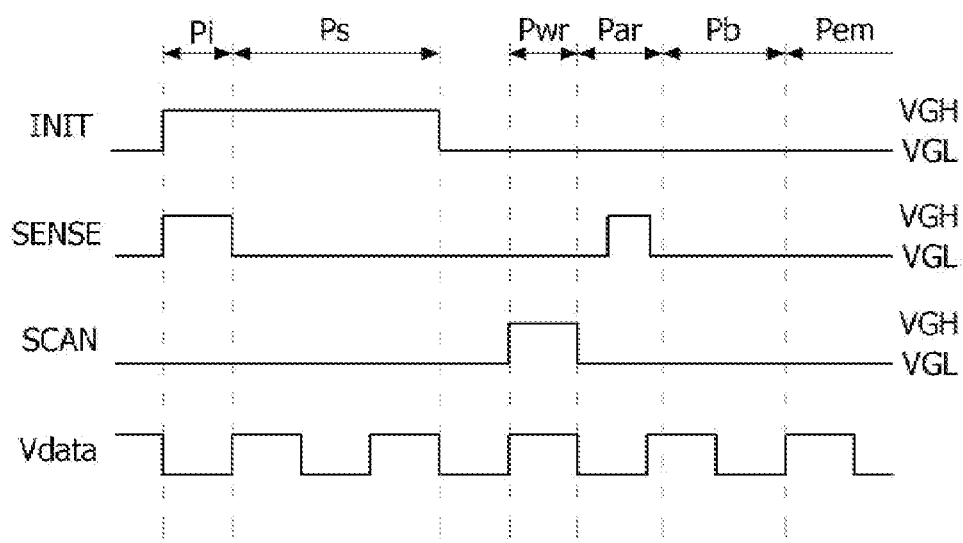
FIG. 28 is a waveform diagram illustrating a gate signal and a data voltage applied to the pixel circuit shown in FIG. 27 according to the fifth embodiment of the present disclosure.

FIG. 27 is a circuit diagram illustrating a pixel circuit according to a fifth embodiment of the present disclosure. FIG. 28 is a waveform diagram illustrating a gate signal and a data voltage applied to the pixel circuit shown in FIG. 27 according to the fifth embodiment of the present disclosure. FIGS. 29 to 33 are diagrams illustrating the operation of the pixel circuit shown in FIG. 27 in stages. according to the fifth embodiment of the present disclosure In this embodiment, the same reference numerals are assigned to the components substantially the same as those of the above-described embodiments, and a detailed description thereof will be omitted.

Referring to FIGS. 27 to 33, the pixel circuit includes a light emitting element EL, a driving element DT for driving the light emitting element EL, a plurality of switch elements T1 to T3, and a plurality of capacitors Cst, Cel, and C2 according to the fifth embodiment of the present disclosure. The driving element DT and the switch elements T1 to T3 may be implemented with n-channel oxide TFTs, for example. In one embodiment, the switch element T3 may be considered "a second switch."

The pixel circuit is connected to the data line DL through which the data voltage Vdata is applied and the gate lines through which the gate signals SCAN, INIT, and SENSE are applied. In addition, the pixel circuit is connected to the power lines through which DC voltages (or constant voltages) are applied, such as the VDD line through which the pixel driving voltage EVDD is applied, the VSS line through which the pixel reference voltage EVSS is applied, the INIT line through which the initialization voltage Vinit is applied, and the REF line RL through which the reference voltage Vref is applied. The power lines may be commonly connected to all pixels.

The gate signals SCAN, INIT, and SENSE are generated as pulses swinging between the gate-on voltage VGH and the gate-off voltage VGL. The gate signals SCAN, INIT, and SENSE include the scan pulse SCAN, the initialization pulse INIT, and the sensing pulse SENSE. The gate driver of the display device may include a first shift register for generating the scan pulse SCAN, a second shift register for generating the initialization pulse INIT, and a third shift register for generating the sensing pulse SENSE.

As shown in FIG. 28, the driving period of the pixel circuit may be divided into an initialization period Pi, a sensing period Ps, a data writing period Pwr, an anode reset period Par, a boosting period Pb, and a light emission period Pem.

In the initialization period Pi, as shown in FIG. 28, the initialization pulse INIT and the sensing pulse SENSE are generated at the gate-on voltage VGH. In the initialization period Pi, the scan pulse SCAN is at the gate-off voltage VGL.

In the sensing period Ps, as shown in FIG. 28, the initialization pulse INIT is generated at the gate-on voltage VGH. The sensing pulse SENSE and the scan pulse SCAN are at the gate-off voltage VGL in the sensing period Ps.

In the data writing period Pwr, as shown in FIG. 28, the scan pulse SCAN is generated at the gate-on voltage VGH synchronized with the data voltage Vdata of the pixel data. The initialization pulse INIT and the sensing pulse SENSE are generated at the gate-off voltage VGL in the data writing period Pwr.

In the anode reset period Par, as shown in FIG. 28, the sensing pulse SENSE is generated at the gate-on voltage VGH. The initialization pulse INIT and the scan pulse SCAN are generated at the gate-off voltage VGL in the anode reset period Par.

In the boosting period Pb and the light emission step Pem, all of the gate signals SCAN, INIT, and SENSE are maintained at the gate-off voltage VGL.

The light emitting element EL may be implemented with an OLED. The anode electrode of the light emitting element EL is connected to the third node DTS. The pixel reference voltage EVSS is applied to the cathode electrode of the light emitting element EL. The light emitting element EL includes the capacitor Cel connected between the anode electrode and the cathode electrode.

The driving element DT generates a current according to the gate-source voltage Vgs to drive the light emitting element EL. The driving element DT includes a first electrode connected to the first node DTD, a gate electrode connected to the second node DTG, and a second electrode connected to the third node DTS. The first node DTD may be connected to the VDD line through which the pixel driving voltage EVDD is applied.

A first capacitor Cst is connected between the second node DTG and the third node DTS to store the gate-source voltage of the driving element DT. A second capacitor C2 is connected between the VDD line through which the pixel driving voltage EVDD is applied and the third node DTS. The second capacitor C2 suppresses a ripple voltage generated by a current being rapidly applied to the third node DTS when the second switch element T3 is turned on, thereby preventing the luminance variation of the light emitting element EL. The second capacitor C2 has a smaller capacitance than that of the first capacitor Cst.

The switch elements T1 to T3 of the pixel circuit include a first switch element T1 for supplying the data voltage Vdata of the pixel data to the second node DTG in response to the scan pulse SCAN, a second switch element T2 for supplying the initialization voltage Vinit to the second node DTG in response to the initialization pulse INIT, a third switch element T3 for supplying the reference voltage Vref to the third node DTS in response to the sensing pulse SENSE.

Figure 29:
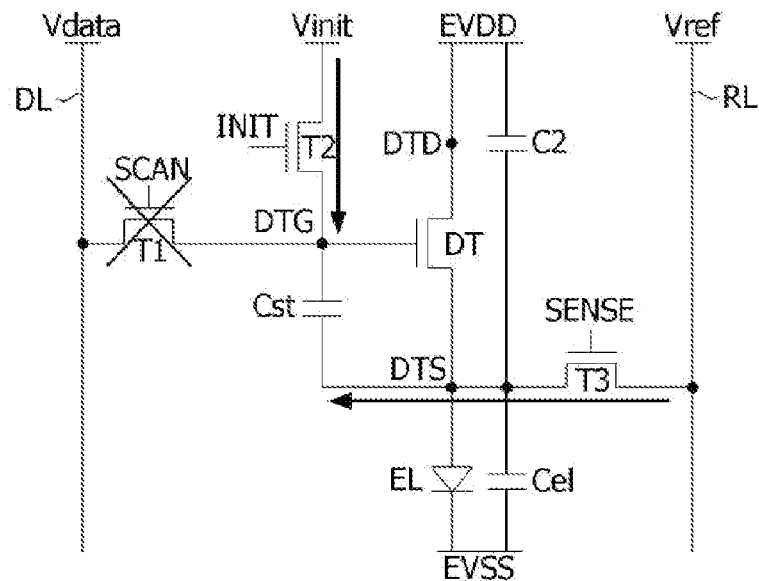
FIG. 29 is a circuit diagram illustrating an initialization period of the pixel circuit shown in FIG. 27 according to the fifth embodiment of the present disclosure.

In the initialization period Pi, as shown in FIG. 29, the second and third switch elements T2 and T3 and the driving element DT are turned on, and the first switch element T1 is turned off. In this case, the light emitting element EL is not turned on. In the initialization period Pi, the main nodes of the pixel circuit are initialized. In the initialization period Pi, the voltage Vg of the second node DTG is the initialization voltage Vinit, and the voltage Vs of the third node DTS is the reference voltage Vref. Accordingly, in the initialization period Pi, the gate-source voltage Vgs of the driving element DT has a value of Vinit-Vref.

In the sensing period Ps, as shown in FIG. 30, the second switch element T2 is turned on, while the first and third switch elements T1 and T3 are turned off. In the sensing period Ps, the gate-source voltage Vgs of the driving element DT reaches the threshold voltage Vth. In the sensing period Ps, the voltage Vs of the third node DTS is changed to a value of Vinit-Vth. Accordingly, at the end of the sensing period Ps, the gate-source voltage Vgs of the driving element DT becomes the threshold voltage Vth, and the threshold voltage Vth is sampled and stored in the capacitor Cst.

Figure 31:
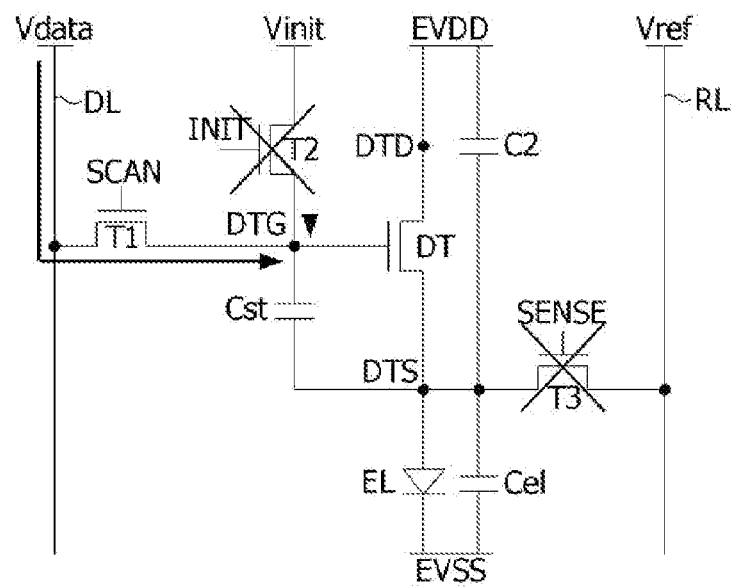
FIG. 31 is a circuit diagram illustrating a data writing period of the pixel circuit shown in FIG. 27 according to the fifth embodiment of the present disclosure.

In the data writing period Pwr, as shown in FIG. 31, the first switch element T1 is turned on, and the other switch elements T2 and T3 except for the first switch element T1 are turned off. In this case, the data voltage Vdata of the pixel data is applied to the second node DTG. In the data writing period Pwr, the voltage of the second node DTG is changed to the data voltage Vdata. At the end of the data writing period Pwr, the voltage Vg of the second node DTG is the data voltage Vdata, and the voltage Vs of the third node DTS has a value of Vinit−Vth. Accordingly, the gate-source voltage Vgs of the driving element DT is changed to a value of Vdata−Vinit+Vth in the data writing period Pwr.

Figure 32:
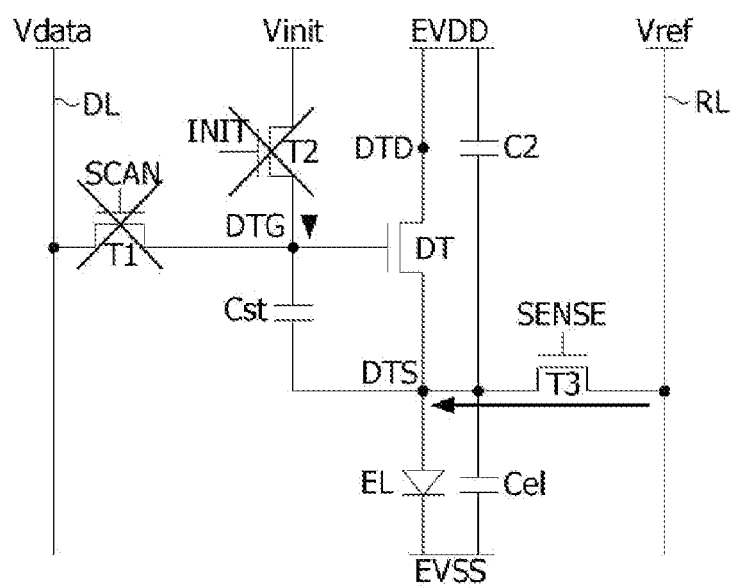
FIG. 32 is a circuit diagram illustrating an anode reset period of the pixel circuit shown in FIG. 27 according to the fifth embodiment of the present disclosure.

In the anode reset period Par, as shown in FIG. 32, the third switch element T3 is turned on, and the other switch elements T1 and T2 are turned off. In the anode reset period Par, the voltage Vs of the third node DTS is changed to the reference voltage Vref, and the voltage Vg of the second node DTG is changed to a value of Vdata−Vinit+Vth+Vref. The gate-source voltage Vgs of the driving element DT is maintained at a value of Vdata−Vinit+Vth.

Figure 33:
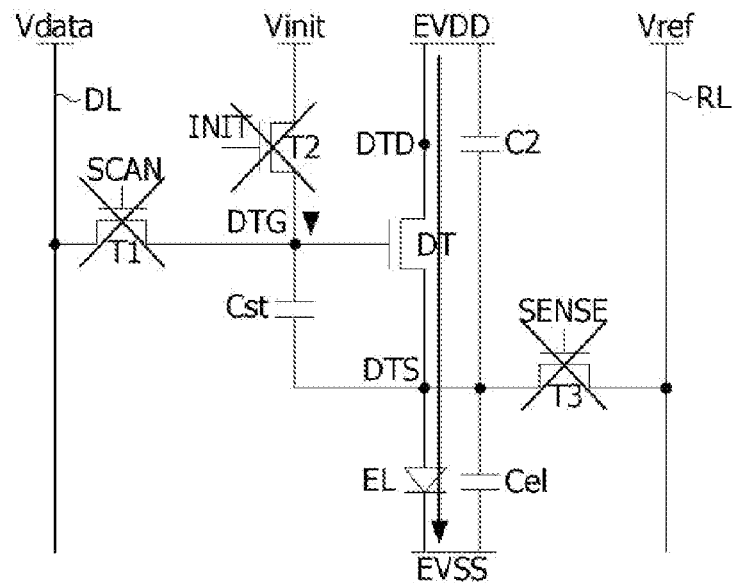
FIG. 33 is a circuit diagram illustrating a boosting period and a light emission period of the pixel circuit shown in FIG. 27 according to the fifth embodiment of the present disclosure.

In the boosting period Pb, as shown in FIG. 33, all the switch elements T1, T2, and T3 are turned off. In this case, the capacitor Cel of the light emitting element EL is charged. In the boosting period Pb, the second and third nodes DTG and DTS are floated, so that the voltages Vg and Vs of the second and third nodes DTG and DTS increase by the capacitor voltage Voled of the light emitting element EL to be changed to a value of Vdata−Vinit+Vth+Vref+Voled and a value of Vref+Voled, respectively. In the boosting period Pb, the gate-source voltage Vgs of the driving element DT is maintained at a value of Vdata−Vinit+Vth. In the light emission period Pem after the period step Pb, the light emitting element EL may emit light by the current Iel, which is equal to a value of $K(Vdata-Vth)^2$, generated according to the gate-source voltage Vgs of the driving element DT.

When the frame frequency of the input image is varied, the pixel circuit shown in FIG. 27 may be driven as shown in FIG. 8. In the present disclosure, as can be seen from the anode reset session A shown in FIG. 8, even if a period during which the pixel data is written into the pixels is changed, the voltage fluctuations of the third node DTS may be prevented by regularly repeating the anode reset step Par. In the present disclosure, an anode reset may be performed without additionally connecting a separate anode reset voltage line to the pixel circuit.

Figure 34A:
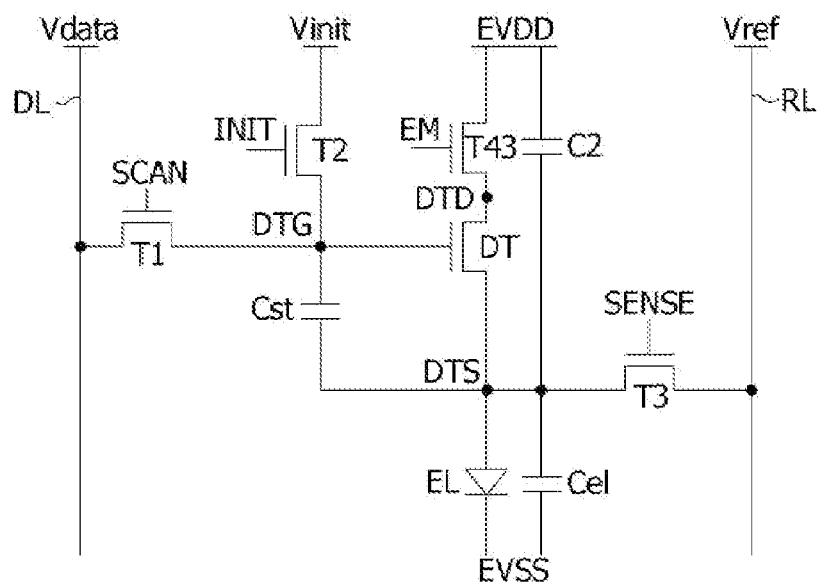
FIGS. 34A and 34B are circuit diagrams illustrating pixel circuits according to a sixth embodiment of the present disclosure.
Figure 34B:
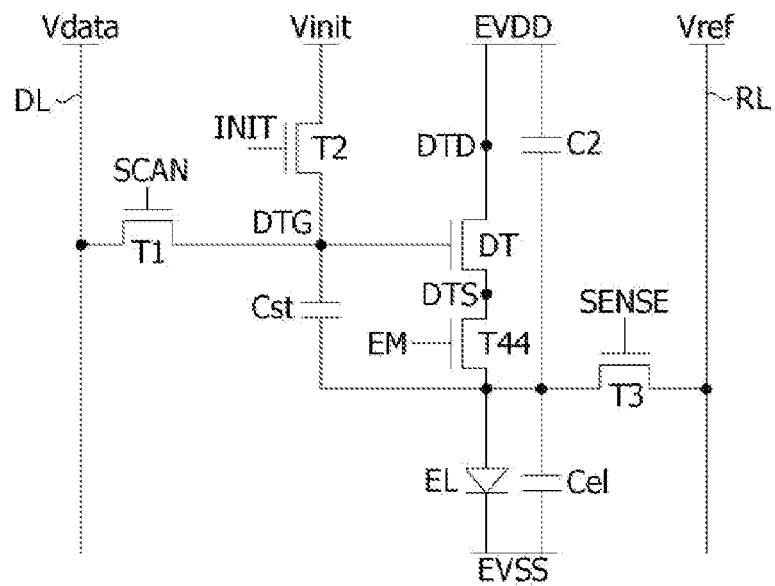
Figure 35:
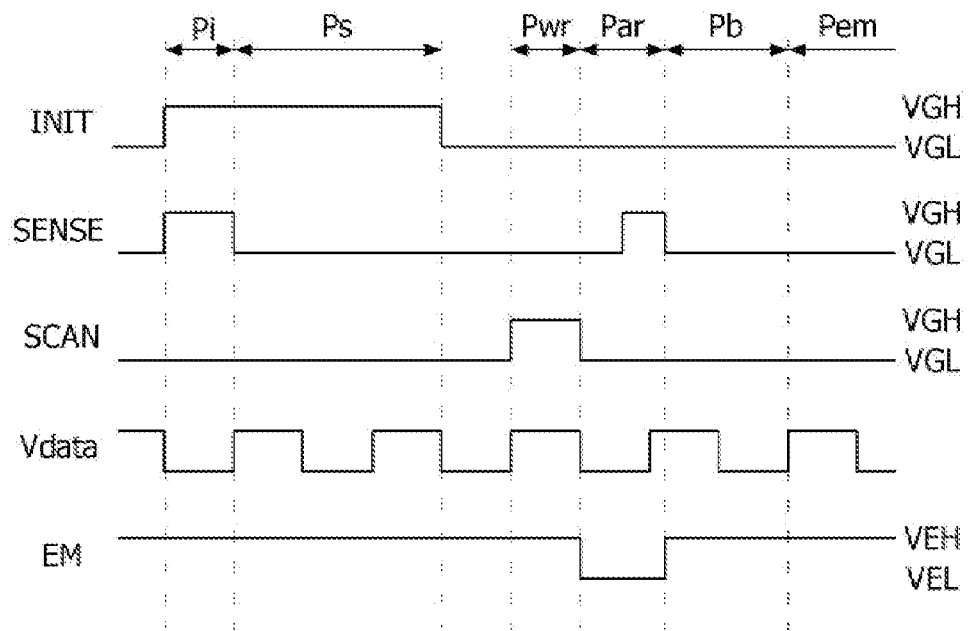
FIG. 35 is a waveform diagram illustrating a gate signal and a data voltage applied to the pixel circuits shown in FIGS. 34A and 34B according to the sixth embodiment of the present disclosure.
Figure 36A:
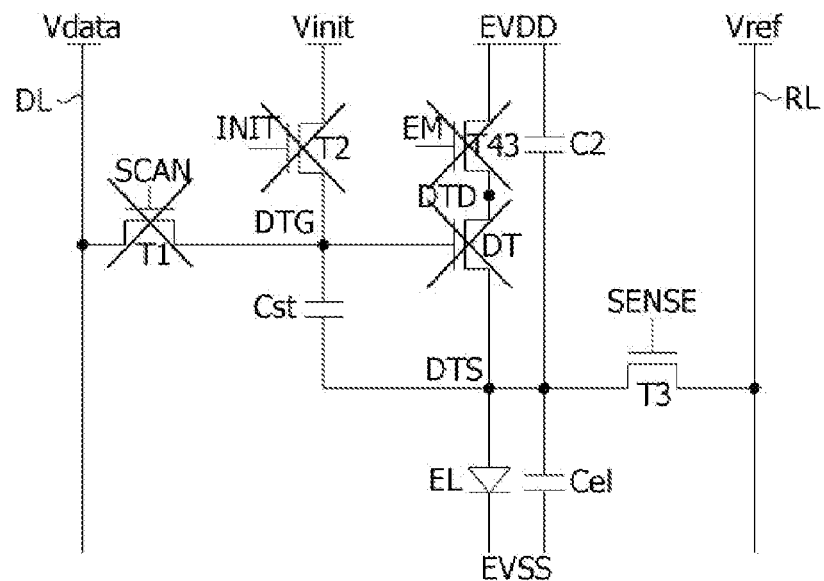
FIGS. 36A and 36B are circuit diagrams illustrating the operations of the pixel circuits shown in FIGS. 34A and 34B in an anode reset period according to the sixth embodiment of the present disclosure.
Figure 36B:
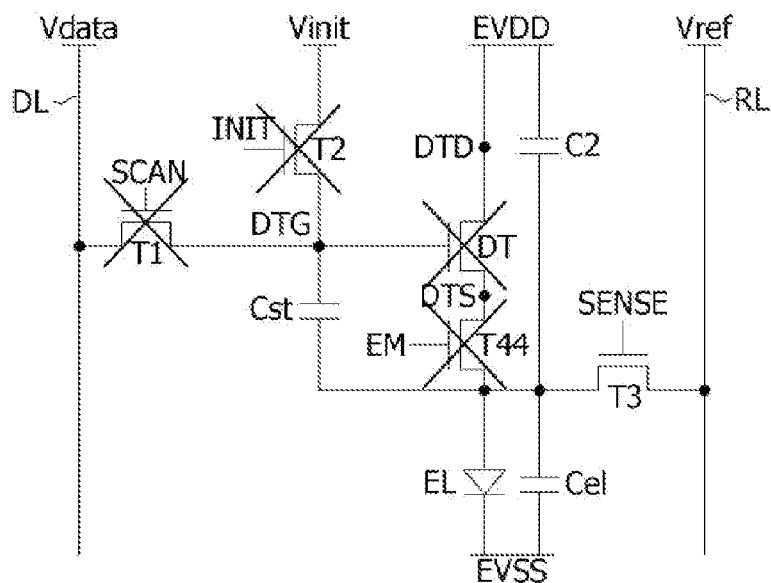

FIGS. 34A and 34B are circuit diagrams illustrating pixel circuits according to a sixth embodiment of the present disclosure. FIG. 35 is a waveform diagram illustrating a gate signal and a data voltage applied to the pixel circuits shown in FIGS. 34A and 34B according to the sixth embodiment of the present disclosure. FIGS. 36A and 36B are circuit diagrams illustrating the operations of the pixel circuits shown in FIGS. 34A and 34B in an anode reset period according to the sixth embodiment of the present disclosure. A detailed description of components in FIGS. 34A to 36B substantially the same as those of the above-described embodiments will be omitted.

Referring to FIGS. 34A to 36B, the pixel circuit includes a light emitting element EL, a driving element DT for driving the light emitting element EL, a plurality of switch elements T1 to T44, and a plurality of capacitors Cst, Cel, and C2 according to the sixth embodiment of the present disclosure. The driving element DT and the switch elements T1 to T44 may be implemented with n-channel oxide TFTs, for example. In one embodiment, the switch element T3 may be considered "a second switch."

The constant voltages, the data voltage, and the voltages VGH, VEH, VGL, and VEL of the gate signals SCAN, INIT, SENSE, and EM applied to the pixel circuit may be set to be the same as in the above-described embodiments.

The gate signals SCAN, INIT, SENSE, and EM are generated as pulses swinging between the gate-on voltage VGH, VEH and the gate-off voltage VGL, VEL. The gate driver of the display device may include a first shift register for generating the scan pulse SCAN, a second shift register for generating the initialization pulse INIT, a third shift register for generating the sensing pulse SENSE, and a fourth shift register for generating the EM pulse.

As shown in FIG. 35, the driving period of the pixel circuit may be divided into an initialization period Pi, a sensing period Ps, a data writing period Pwr, an anode reset period Par, a boosting period Pb, and a light emission period Pem.

In the initialization period Pi, as shown in FIG. 35, the initialization pulse INIT, the sensing pulse SENSE, and the EM pulse EM are generated at the gate-on voltages VGH and VEH. In the initialization period Pi, the scan pulse SCAN is at the gate-off voltage VGL.

In the sensing period Ps, as shown in FIG. 35, the initialization pulse INIT and the EM pulse EM are generated at the gate-on voltages VGH and VEH. The sensing pulse SENSE and the scan pulse SCAN are at the gate-off voltages VGL in the sensing period Ps.

In the data writing period Pwr, as shown in FIG. 35, the scan pulse SCAN is generated at the gate-on voltage VGH synchronized with the data voltage Vdata of the pixel data. In the data writing period Pwr, the EM pulse EM is maintained at the gate-on voltage VEH. The initialization pulse INIT and the sensing pulse SENSE are generated at the gate-off voltage VGL in the data writing step Pwr.

In the anode reset period Par, as shown in FIG. 35, the sensing pulse SENSE is generated at the gate-on voltage VGH. In the anode reset period Par, the EM pulse EM is inverted to the gate-off voltage VEL. The initialization pulse INIT and the scan pulse SCAN are generated at the gate-off voltage VGL in the anode reset period Par.

In the boosting period Pb and the light emission period Pem, the EM pulse EM is generated at the gate-on voltage VEH, and the other gate signals SCAN, INIT, and SENSE are at the gate-off voltage VGL.

Fourth switch elements T43 and T44 may include, as shown in FIGS. 34A and 34B, at least one of a fourth-first switch element T43 connected between the VDD line through which the pixel driving voltage EVDD is applied and the first node DTD, and a fourth-second switch elements T44 connected between the driving element DT and the light emitting element EL.

In the initialization period Pi, the second, third, and fourth switch elements T2, T3, T43, and T44 and the driving element DT are turned on, and the first switch element T1 is turned off. In this case, the light emitting element EL is not turned on. In the initialization period Pi, the main nodes of the pixel circuit are initialized.

In the sensing period Ps, the second and fourth switch elements T2, T43, and T44 are turned on, while the first and third switch elements T1 and T3 are turned off. In the sensing period Ps, the gate-source voltage Vgs of the driving element DT reaches the threshold voltage Vth. In the sensing period Ps, the threshold voltage Vth of the driving element DT is sampled and stored in the capacitor Cst.

In the data writing period Pwr, the first and fourth switch elements T1, T43, and T44 are turned on, and the other switch elements T2 and T3 are turned off. In this case, the data voltage Vdata of the pixel data is applied to the second node DTG.

In the anode reset period Par, as shown in FIGS. 36A and 36B, the third switch element T3 is turned on, and the other switch elements T1, T2, T43 and T44 are turned off.

In the boosting period Pb, other switch elements T1, T2, and T3 except the fourth switch elements T43 and T44 are turned off. In this case, the capacitor of the light emitting element EL is charged. In the boosting period Pb, the second and third nodes DTG and DTS are floated, so that the voltages Vg and Vs of the second and third nodes DTG and DTS increase by the capacitor voltage Voled of the light emitting element EL. In the light emission period Pem after the boosting period Pb, the light emitting element EL may emit light by a current generated according to the gate-source voltage Vgs of the driving element DT.

When the frame frequency of the input image is varied, the pixel circuits shown in FIGS. 34A and 34B may be driven as shown in FIG. 12.

The frame frequency of the input image may be varied in a wide frequency range, for example, as shown in FIG. 12, to 30 Hz, 60 Hz, 120 Hz, and 240 Hz. As can be seen from the anode reset session A shown in FIG. 12, even if a period during which the pixel data is written into the pixels is changed, the voltage fluctuations of the third node DTS may be prevented by regularly repeating the anode reset period Par. In the present disclosure, an anode reset may be performed without additionally connecting a separate anode reset voltage line to the pixel circuit.

Figure 37:
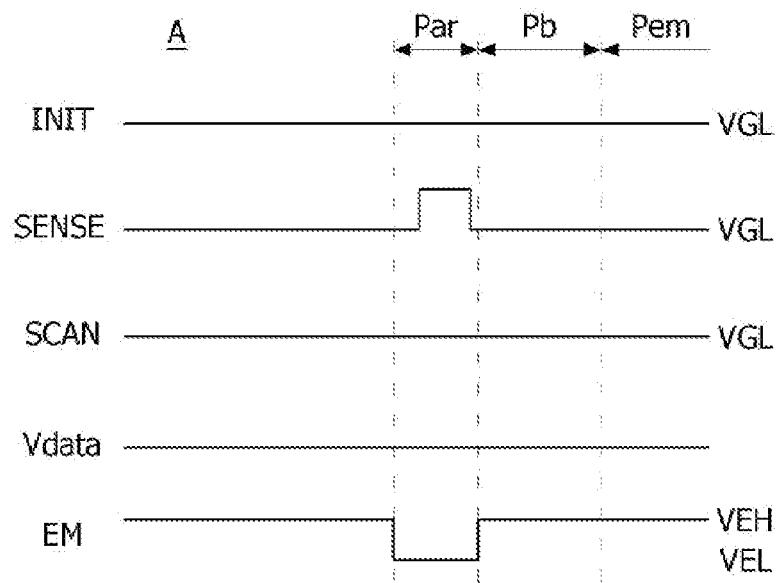
FIG. 37 is a waveform diagram illustrating a gate signal supplied to the pixel circuits shown in FIGS. 34A and 34B during an anode reset session when a frame frequency of an input image is varied as shown in FIG. 12 according to the sixth embodiment of the present disclosure.

During the anode reset session A, as shown in FIG. 37, the sensing pulse SENSE is generated at the gate-on voltage VGH and the EM pulse EM is inverted to the gate-off voltage VEL. During the anode reset session A, the other gate signals SCAN and INIT and the data voltage Vdata of the pixel data are not generated. Therefore, in the present disclosure, since the anode reset pulse AR is applied to the pixels at the same frequency no matter how the frame frequency is changed, it is possible to prevent the luminance variation of the pixels occurring when the frame frequency is changed.

Figure 38:
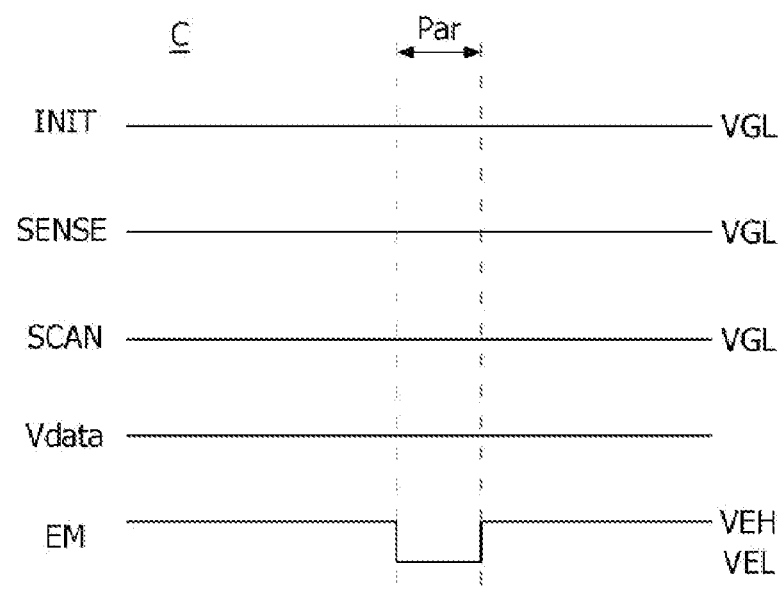
FIG. 38 is a waveform diagram illustrating a gate signal supplied to the pixel circuits shown in FIGS. 34A and 34B during an EM OFF session when a frame frequency of an input image is varied as shown in FIG. 12 according to the sixth embodiment of the present disclosure.

During the EM OFF session C, as shown in FIG. 38, the sensing pulse SENSE is generated at the gate-on voltage VGH and the EM pulse EM is inverted to the gate-off voltage VEL. During the EM OFF session C, the pulses of the other gate signals SCAN and INIT and the data voltage Vdata of the pixel data are not generated.

Figure 39:
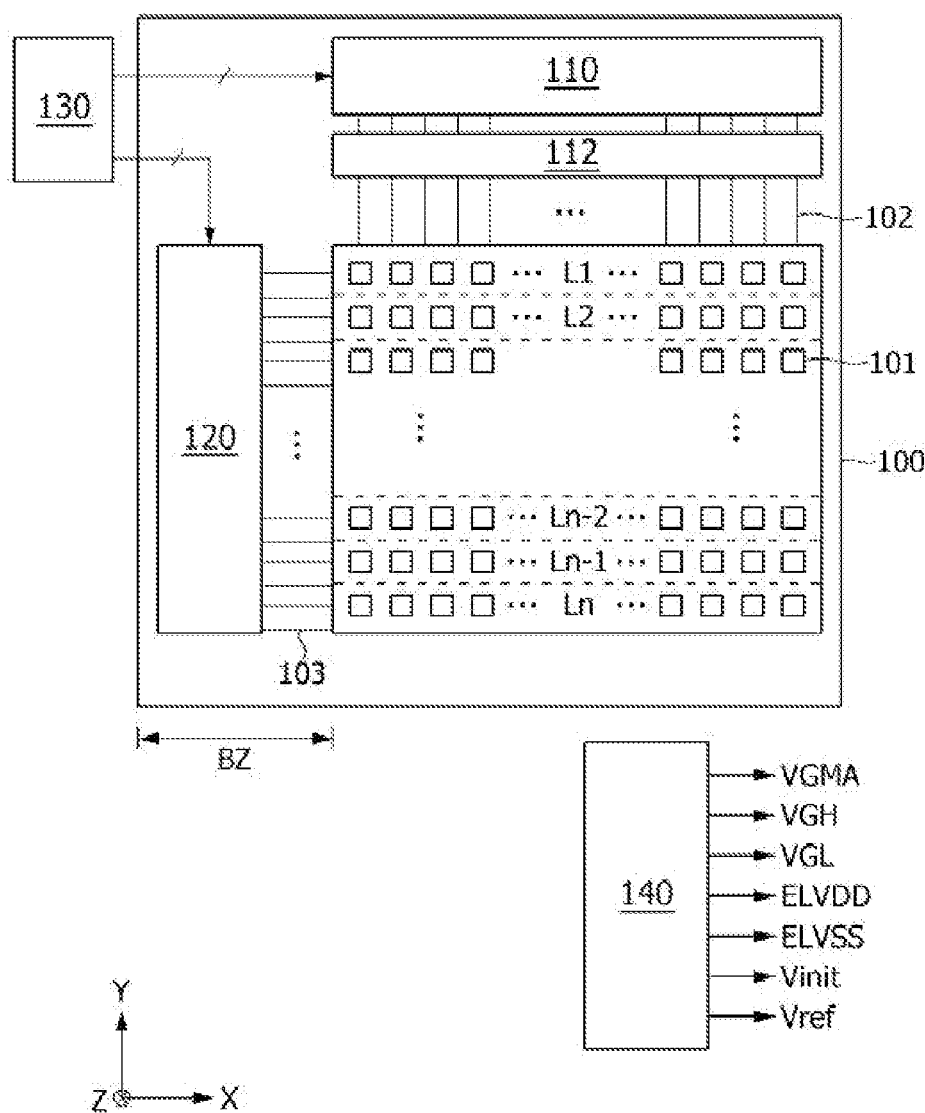
FIG. 39 is a block diagram illustrating a display device according to an embodiment of the present disclosure.
Figure 40:
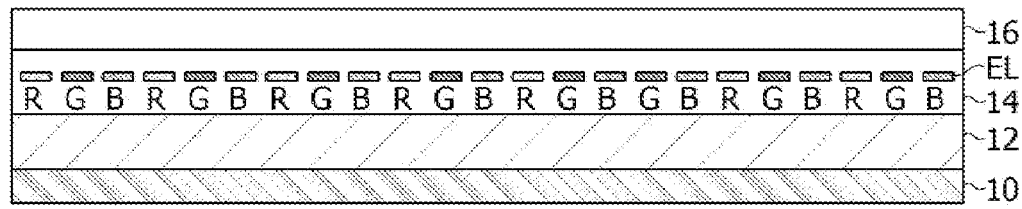
FIG. 40 is a cross-sectional view illustrating a cross-sectional structure of a display panel shown in FIG. 39 according to an embodiment of the present disclosure.
Figure 40:
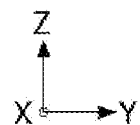

FIG. 39 is a block diagram illustrating a display device according to an embodiment of the present disclosure. FIG. 40 is a cross-sectional view illustrating a cross-sectional structure of a display panel shown in FIG. 39 according to an embodiment of the present disclosure.

Referring to FIGS. 39 and 40, a display device according to an embodiment of this disclosure includes a display panel 100, a display panel driver for writing pixel data to pixels of the display panel 100, and a power supply 140 for generating power required to drive the pixels 101 and the display panel driver.

The display panel 100 may be a panel having a rectangular structure with a length in the X-axis direction, a width in the Y-axis direction, and a thickness in the Z-axis direction. The display panel 100 includes a pixel array that displays an input image on a screen. The pixel array includes a plurality of data lines 102, a plurality of gate lines 103 that cross the plurality of data lines 102, and pixels 101 arranged in a matrix form. The display panel 100 may further include power lines commonly connected to the pixels 101. The power lines supply a constant voltage required for driving the pixels 101 to the pixels 101. For example, the display panel 100 may include a VDD line to which a pixel driving voltage ELVDD is applied, and a VSS line to which a low-potential power supply voltage ELVSS is applied. In addition, the power lines may further include a REF line to which the reference voltage Vref is applied, and an INIT line to which the initialization voltage Vinit is applied.

As shown in FIG. 40, the cross-sectional structure of the display panel 100 may include a circuit layer 12 stacked on a substrate 10, a light emitting element layer 14, and an encapsulation layer 16.

The circuit layer 12 may include a TFT array including a pixel circuit connected to wires such as a data line, a gate line, a power line, and the like, a de-multiplexer array 112, a gate driver 120 and the like. The wire and circuit elements of the circuit layer 12 may include a plurality of insulating layers, two or more metal layers separated with the insulating layer therebetween, and an active layer including a semiconductor material. All transistors formed in the circuit layer 12 may be implemented as an n-channel oxide TFT.

The light emitting element layer 14 may include a light emitting element EL driven by the pixel circuit. The light emitting element EL may include a red (R) light emitting element, a green (G) light emitting element, and a blue (B) light emitting element.

In another embodiment, the light emitting element layer 14 may include a white light emitting element and a color filter. The light emitting elements EL of the light emitting element layer 14 may be covered by multiple protective layers in which an organic layer and an inorganic layer are stacked.

The encapsulation layer 16 covers the light emitting element layer 14 to seal the circuit layer 12 and the light emitting element layer 14. The encapsulation layer 16 may also have a multi-insulating film structure in which an organic film and an inorganic film are alternately stacked. The inorganic film blocks or at least reduces permeation of moisture and oxygen. The organic film planarizes the surface of the inorganic film. When the organic layer and the inorganic layer are stacked in multiple layers, the movement path of moisture or oxygen becomes longer than that of a single layer, so that penetration of moisture and oxygen affecting the light emitting element layer 14 can be effectively blocked.

A touch sensor layer omitted from the drawing may be formed on the encapsulation layer 16, and a polarizer or a color filter layer may be disposed thereon. The touch sensor layer may include capacitive touch sensors that sense a touch input based on a change in capacitances before and after the touch input. The touch sensor layer may include insulating layers and metal wire patterns forming the capacitance of the touch sensors. The insulating layers may insulate the crossing portions of the metal wire patterns, and may planarize the surface of the touch sensor layer. The polarizer may improve visibility and contrast ratio by converting the polarization of external light reflected by the metal of the touch sensor layer and the circuit layer. The polarizer may be implemented as a polarizer or a circular polarizer to which a linear polarizer and a phase retardation film are bonded. A cover glass may be adhered to the polarizer. The color filter layer may include red, green, and blue color filters. The color filter layer may further include a black matrix pattern. The color filter layer absorbs a portion of the wavelength of light reflected from the circuit layer and the touch sensor layer, so that it can replace the polarizer and increase the color purity of the image reproduced in the pixel array.

The pixel array includes a plurality of pixel lines L1 to Ln. Each of the pixel lines L1 to Ln includes one line of pixels arranged along the line direction (X-axis direction) in the pixel array of the display panel 100. The pixels arranged in one pixel line share a same gate line 103. Sub-pixels arranged in the column direction Y along the data line direction share the same data line 102. One horizontal period is a time obtained by dividing one frame period by the total number of pixel lines L1 to Ln.

The display panel 100 may be implemented as a non-transmissive display panel or a transmissive display panel. The transmissive display panel may be applied to a transparent display device in which an image is displayed on a screen and an actual background is visible. The display panel 100 may be manufactured as a flexible display panel.

Each of the pixels 101 may be divided into a red sub-pixel, a green sub-pixel, and a blue sub-pixel to implement color. Each of the pixels may further include a white sub-pixel. Each of the sub-pixels includes a pixel circuit. Hereinafter, a pixel may be interpreted as having the same meaning as a sub-pixel. Each of the pixel circuits is connected to a data line, gate lines, and power lines.

The pixels 101 may be arranged as real color pixels and pentile pixels. The pentile pixel may implement a higher resolution than a real color pixel by driving two sub-pixels having different colors as one pixel 101 using a preset pixel rendering algorithm. The pixel rendering algorithm may compensate for insufficient color representation in each pixel with the color of light emitted from an adjacent pixel.

The power supply 140 generates a direct current (DC) voltage (or a constant voltage) required for driving the pixel array of the display panel 100 and the display panel driver by using a DC-DC converter. The DC-DC converter may include a charge pump, a regulator, a buck converter, a boost converter, and the like. The power supply 140 may generate DC voltage (or constant voltage) such as the gamma reference voltage VGMA, gate-on voltage VGH, gate-off voltage VGL, pixel driving voltage ELVDD, low-potential power supply voltage ELVSS, initialization voltage Vinit, reference voltage Vref, or the like by adjusting the level of the DC input voltage applied from the host system (not shown). The gamma reference voltage VGMA is supplied to the data driver 110. The gate-on voltage VGH and the gate-off voltage VGL are supplied to the gate driver 120. The constant voltage such as pixel driving voltage ELVDD, low-potential power supply voltage ELVSS, initialization voltage Vinit, reference voltage Vref, or the like is supplied to the pixels 101 through power lines commonly connected to the pixels 101. The constant voltages applied to the pixel circuit may have different voltage levels.

The display panel driver writes the pixel data of the input image to the pixels of the display panel 100 under the control of the timing controller 130.

The display panel driver includes the data driver 110 and the gate driver 120. The display panel driver may further include a de-multiplexer array 112 disposed between the data driver 110 and the data lines 102.

The de-multiplexer array 112 sequentially supplies the data voltages outputted from the channels of the data driver 110 to the data lines 102 using a plurality of de-multiplexers (DEMUX). The de-multiplexer may include a multiple of switch elements disposed on the display panel 100. When the de-multiplexer is disposed between the output terminals of the data driver 110 and the data lines 102, the number of channels of the data driver 110 may be reduced. The de-multiplexer array 112 may be omitted.

The display panel driver may further include a touch sensor driver for driving the touch sensors. The touch sensor driver is omitted from FIG. 39. The data driver 110 and the touch sensor driver may be integrated into a single drive integrated circuit (IC). In a mobile device or a wearable device, the timing controller 130, the power supply 140, the data driver 110, and the like may be integrated into one drive IC.

The display panel driver may operate in a low speed driving mode under the control of the timing controller 130. The low speed driving mode may be set to reduce power consumption of the display device when the input image does not change by a preset number of frames by analyzing the input image. In the low speed driving mode, the power consumption of the display panel driver and the display panel 100 may be reduced by lowering a refresh rate of pixels when a still image is inputted for a predetermined time or longer. The low speed driving mode is not limited to when a still image is inputted. For example, when the display device operates in the standby mode or when a user command or an input image is not inputted to the display panel driving circuit for a predetermined time or longer, the display panel driving circuit may operate in the low speed driving mode.

The data driver 110 receives pixel data of an input image received as a digital signal from the timing controller 130, and outputs a data voltage. The data driver 110 generates a data voltage Vdata by converting pixel data of an input image into a gamma compensation voltage every frame period using a digital to analog converter (DAC). The gamma reference voltage VGMA is divided into a gamma compensation voltage for each gray scale through a voltage divider circuit. The gamma compensation voltage for each gray level is provided to the DAC of the data driver 110. The data voltage Vdata is outputted from each of the channels of the data driver 110 through an output buffer.

The gate driver 120 may be implemented as a gate in panel (GIP) circuit formed in the circuit layer 12 on the display panel 100 together with the TFT array and wires of the pixel array. The gate driver 120 may be disposed on a bezel BZ, which is non-display region of the display panel 100, or may be distributedly disposed in a pixel array in which an input image is reproduced. The gate driver 120 sequentially outputs the gate signal to the gate lines 103 under the control of the timing controller 130. The gate driver 120 may sequentially supply the gate signals to the gate lines 103 while shifting the gate signals using a shift register. The gate signal may include various gate pulses such as a scan pulse, a sensing pulse, an initialization pulse, a light emitting control pulse (hereinafter, referred to as an "EM pulse") and the like.

The timing controller 130 receives digital video data DATA of an input image from the host system, and a timing signal synchronized with the digital video data DATA. The timing signal may include a vertical synchronization signal Vsync, a horizontal synchronization signal Hsync, a clock CLK, a data enable signal DE, and the like. Since the vertical period and the horizontal period can be known by means of counting the data enable signal DE, the vertical synchronization signal Vsync and the horizontal synchronization signal Hsync may be omitted. The data enable signal DE has a period of one horizontal period (1H).

The host system may be any one of a TV (Television) system, a tablet computer, a notebook computer, a navigation system, a personal computer (PC), a home theater system, a mobile device, a wearable device, and a vehicle system. The host system may scale the image signal from the video source to fit the resolution of the display panel 100, and may transmit it to the timing controller 130 together with the timing signal.

The timing controller 130 may multiply the input frame frequency by i (i is a natural number) in the normal driving mode, so that it can control the operation timing of the display panel driver at a frame frequency of the input frame frequency×i Hz. The input frame frequency is 60 Hz in the National Television Standards Committee (NTSC) scheme, while it is 50 Hz in the phase-alternating line (PAL) scheme.

The host system or the timing controller 130 may vary the frame frequency according to the motion of the input image or the characteristics of the contents.

The timing controller 130 lowers a frequency of a frame rate at which pixel data is written to pixels in the low speed driving mode compared to the normal driving mode. For example, in the normal driving mode, a data refresh frame frequency at which pixel data is written to pixels may occur at a frequency of 60 Hz or higher, for example, at a refresh rate of any one of 60 Hz, 120 Hz, and 144 Hz, and the data refresh frame DRF in the low speed driving mode may occur at a refresh rate of a lower frequency than that of the low speed driving mode. For example, the timing controller 130 may lower the driving frequency of the display panel driver by lowering the frame frequency to a frequency between 1 Hz and 30 Hz in order to lower the refresh rate of pixels in the low speed driving mode.

The timing controller 130 generates a data timing control signal for controlling the operation timing of the data driver 110 based on the timing signals Vsync, Hsync, DE received from the host system, a control signal for controlling the operation timing of the de-multiplexer array 112, and a gate timing control signal for controlling the operation timing of the gate driver 120. The timing controller 130 controls the operation timing of the display panel driver to synchronize the data driver 110, the de-multiplexer array 112, the touch sensor driver, and the gate driver 120.

The gate timing control signal generated from the timing controller 130 may be inputted to the shift register of the gate driver 120 through a level shifter (not shown). The level shifter may receive the gate timing control signal, generate a start pulse and a shift clock, and provide them to the shift register.

A pixel circuit and a display device including the same according to embodiments of the present disclosure may be described as follows.

As shown in FIGS. 1 to 14, a pixel circuit comprises a driving element including a first electrode connected to a first node to which a pixel driving voltage is applied, a gate electrode connected to a second node, and a second electrode connected to a third node; a light emitting element including an anode electrode connected to the third node, and a cathode electrode connected to a VSS line through which a pixel reference voltage lower than the pixel driving voltage is applied, and configured to be driven by a current from the driving element; a first switch element configured to supply a data voltage of pixel data to the second node in response to a scan pulse; a second switch element configured to supply an initialization voltage to the second node in response to an initialization pulse; a third switch element configured to supply a reference voltage lower than the initialization voltage to the third node in response to a sensing pulse; a fourth switch element configured to connect the third node to the VSS line in response to an anode reset pulse; and a capacitor connected between the second node and the third node.

The first switch element includes a gate electrode to which the scan pulse is applied, a first electrode connected to a data line through which the data voltage is applied, and a second electrode connected to the second node. The second switch element includes a gate electrode to which the initialization pulse is applied, a first electrode to which the initialization voltage is applied, and a second electrode connected to the second node. The third switch element includes a gate electrode to which the sensing pulse is applied, a first electrode connected to the third node, and a second electrode connected to a REF line through which the reference voltage is applied. The fourth switch element includes a gate electrode to which the anode reset pulse is applied, a first electrode connected to the third node, and a second electrode connected to the VSS line.

A driving period of the pixel circuit is divided into an initialization step, a sensing step, a data writing step, an anode reset step, a boosting step, and a light emission step. In the initialization step, the initialization pulse and the sensing pulse are generated at a gate-on voltage, and the scan pulse and the anode reset pulse are at a gate-off voltage. In the sensing step, the initialization pulse is generated at the gate-on voltage, and the sensing pulse, the scan pulse, and the anode reset pulse are at the gate-off voltage. In the data writing step, the scan pulse is generated at the gate-on voltage synchronized with the data voltage, and the initialization pulse, the sensing pulse, and the anode reset pulse are at the gate-off voltage. In the anode reset step, the anode reset pulse is generated at the gate-on voltage, and the initialization pulse, the sensing pulse, and the scan pulse are at the gate-off voltage. In the boosting step and the light emission step, the initialization pulse, the sensing pulse, the scan pulse, and the anode reset pulse are at the gate-off voltage. Each of the first to fourth switch elements is turned on in response to the gate-on voltage, and is turned off in response to the gate-off voltage.

A frequency of the anode reset pulse is fixed when a frame frequency of an input image is changed.

When the frame frequency of the input image is changed, a frequency of each of the initialization pulse, the sensing pulse, and the scan pulse is changed in proportion to the frame frequency.

The pixel circuit further comprises at least one of a fifth-first switch element connected between a VDD line through which the pixel driving voltage is applied and the first node, and a fifth-second switch element connected between the driving element and the light emitting element. The fifth-first switch element and the fifth-second switch element are turned on in response to a gate-on voltage of an emission control pulse and turned off in response to a gate-off voltage of the emission control pulse. The emission control pulse is generated at the gate-on voltage in initialization step, the sensing step, the data writing step, the boosting step, and the light emission step, and is generated at the gate-off voltage in the anode reset step.

A frequency of the anode reset pulse is fixed when a frame frequency of an input image is changed.

As shown in FIGS. 15 to 21, a pixel circuit comprises a driving element including a first electrode connected to a first node to which a pixel driving voltage is applied, a gate electrode connected to a second node, and a second electrode connected to a third node; a light emitting element including an anode electrode connected to the third node, and a cathode electrode connected to a VSS line through which a pixel reference voltage lower than the pixel driving voltage is applied, and configured to be driven by a current from the driving element; a first switch element configured to supply a data voltage of pixel data to the second node in response to a scan pulse; a second switch element configured to supply an initialization voltage to the second node in response to an initialization pulse; a third switch element configured to supply a reference voltage lower than the initialization voltage to the third node in response to a sensing pulse; a fourth switch element configured to connect the third node to a fourth node in response to an anode reset pulse; and a capacitor connected between the second node and the fourth node.

The first switch element includes a gate electrode to which the scan pulse is applied, a first electrode connected to a data line through which the data voltage is applied, and a second electrode connected to the second node. The second switch element includes a gate electrode to which the initialization pulse is applied, a first electrode to which the initialization voltage is applied, and a second electrode connected to the second node. The third switch element includes a gate electrode to which the sensing pulse is applied, a first electrode connected to the third node, and a second electrode connected to a REF line through which the reference voltage is applied. The fourth switch element includes a gate electrode to which the anode reset pulse is applied, a first electrode connected to the fourth node, and a second electrode connected to the third node.

A driving period of the pixel circuit is divided into an initialization step, a sensing step, a data writing step, an anode reset step, a boosting step, and a light emission step. In the initialization step, the initialization pulse, the sensing pulse, and the anode reset pulse are generated at a gate-on voltage, and the scan pulse is at a gate-off voltage. In the sensing step, the initialization pulse and the anode reset pulse are generated at the gate-on voltage, and the sensing pulse and the scan pulse are at the gate-off voltage. In the data writing step, the scan pulse and the anode reset pulse are generated at the gate-on voltage, and the initialization pulse and the sensing pulse are at the gate-off voltage. In the anode reset step, the sensing pulse is generated at the gate-on voltage, and the initialization pulse, the scan pulse, and the anode reset pulse are at the gate-off voltage. In the boosting step and the light emission step, the anode reset pulse is generated at the gate-on voltage, and the initialization pulse, the sensing pulse, and the scan pulse are at the gate-off voltage. Each of the first to fourth switch elements is turned on in response to the gate-on voltage, and is turned off in response to the gate-off voltage.

A frequency of the anode reset pulse is fixed when a frame frequency of an input image is changed.

When the frame frequency of the input image is changed, a frequency of each of the initialization pulse, the sensing pulse, and the scan pulse is changed in proportion to the frame frequency.

The pixel circuit further comprises at least one of a fifth-first switch element connected between a VDD line through which the pixel driving voltage is applied and the first node, and a fifth-second switch element connected between the driving element and the light emitting element. The fifth-first switch element and the fifth-second switch element are turned on in response to a gate-on voltage of an emission control pulse and turned off in response to a gate-off voltage of the emission control pulse. The emission control pulse is generated at the gate-on voltage in initialization step, the sensing step, the data writing step, the boosting step, and the light emission step, and is generated at the gate-off voltage in the anode reset step.

A frequency of the anode reset pulse is fixed when a frame frequency of an input image is changed.

As shown in FIGS. 27 to 35, a pixel circuit comprises a driving element including a first electrode connected to a VDD line through which a pixel driving voltage is applied, a gate electrode connected to a second node, and a second electrode connected to a third node; a light emitting element including an anode electrode connected to the third node, and a cathode electrode connected to a VSS line through which a pixel reference voltage lower than the pixel driving voltage is applied, and configured to be driven by a current from the driving element; a first switch element configured to supply a data voltage of pixel data to the second node in response to a scan pulse; a second switch element configured to supply an initialization voltage to the second node in response to an initialization pulse; a third switch element configured to supply a reference voltage lower than the initialization voltage to the third node in response to a sensing pulse; a first capacitor connected between the second node and the third node; and a second capacitor connected between the VDD line and the third node, and having a capacitance smaller than that of the first capacitor.

The first switch element includes a gate electrode to which the scan pulse is applied, a first electrode connected to a data line through which the data voltage is applied, and a second electrode connected to the second node. The second switch element includes a gate electrode to which the initialization pulse is applied, a first electrode to which the initialization voltage is applied, and a second electrode connected to the second node. The third switch element includes a gate electrode to which the sensing pulse is applied, a first electrode connected to the third node, and a second electrode connected to a REF line through which the reference voltage is applied.

A driving period of the pixel circuit is divided into an initialization step, a sensing step, a data writing step, an anode reset step, a boosting step, and a light emission step. In the initialization step, the initialization pulse and the sensing pulse are generated at a gate-on voltage, and the scan pulse is at a gate-off voltage. In the sensing step, the initialization pulse is generated at the gate-on voltage, and the sensing pulse and the scan pulse are at the gate-off voltage. In the data writing step, the scan pulse is generated at the gate-on voltage, and the initialization pulse and the sensing pulse are at the gate-off voltage. In the anode reset step, the sensing pulse is generated at the gate-on voltage, and the initialization pulse and the scan pulse are at the gate-off voltage. In the boosting step and the light emission step, the initialization pulse, the sensing pulse, and the scan pulse are at the gate-off voltage. Each of the first to third switch elements is turned on in response to the gate-on voltage, and is turned off in response to the gate-off voltage.

When the frame frequency of the input image is changed, a frequency of each of the initialization pulse, the sensing pulse, and the scan pulse is changed in proportion to the frame frequency.

The pixel circuit further comprises at least one of a fourth-first switch element connected between a VDD line through which the pixel driving voltage is applied and a first node, and a fourth-second switch element connected between the driving element and the light emitting element. The fourth-first switch element and the fourth-second switch element are turned on in response to a gate-on voltage of an emission control pulse and are turned off in response to a gate-off voltage of the emission control pulse. The emission control pulse is generated at the gate-on voltage in initialization step, the sensing step, the data writing step, the boosting step, and the light emission step, and is generated at the gate-off voltage in the anode reset step.

As shown in FIGS. 1 to 14, 39 and 40, a display device comprises a display panel on which a plurality of pixel circuits are disposed; a data driver configured to generate a data voltage of the pixel data; and a gate driver configured to generate an initialization pulse, a sensing pulse, a scan pulse, and an anode reset pulse. Each of the pixel circuits includes a driving element including a first electrode connected to a first node to which a pixel driving voltage is applied, a gate electrode connected to a second node, and a second electrode connected to a third node; a light emitting element including an anode electrode connected to the third node, and a cathode electrode connected to a VSS line through which a pixel reference voltage lower than the pixel driving voltage is applied, and configured to be driven by a current from the driving element; a first switch element configured to supply the data voltage of the pixel data to the second node in response to a scan pulse; a second switch element configured to supply an initialization voltage to the second node in response to an initialization pulse; a third switch element configured to supply a reference voltage lower than the initialization voltage to the third node in response to a sensing pulse; a fourth switch element configured to connect the third node to the VSS line in response to an anode reset pulse; and a capacitor connected between the second node and the third node As shown in FIGS. 15 to 21, 39 and 40, a display device comprises a display panel on which a plurality of pixel circuits are disposed; a data driver configured to generate a data voltage of the pixel data; and a gate driver configured to generate an initialization pulse, a sensing pulse, a scan pulse, and an anode reset pulse. Each of the pixel circuits includes a driving element including a first electrode connected to a first node to which a pixel driving voltage is applied, a gate electrode connected to a second node, and a second electrode connected to a third node; a light emitting element including an anode electrode connected to the third node, and a cathode electrode connected to a VSS line through which a pixel reference voltage lower than the pixel driving voltage is applied, and configured to be driven by a current from the driving element; a first switch element configured to supply the data voltage of the pixel data to the second node in response to a scan pulse; a second switch element configured to supply an initialization voltage to the second node in response to an initialization pulse; a third switch element configured to supply a reference voltage lower than the initialization voltage to the third node in response to a sensing pulse; a fourth switch element configured to connect the third node to a fourth node in response to an anode reset pulse; and a capacitor connected between the second node and the fourth node.

As shown in FIGS. 27 to 35, 39 and 40, a display device comprises a display panel on which a plurality of pixel circuits are disposed; a data driver configured to generate a data voltage of the pixel data; and a gate driver configured to generate an initialization pulse, a sensing pulse, a scan pulse, and an anode reset pulse. Each of the pixel circuits includes a driving element including a first electrode connected to a VDD line through which a pixel driving voltage is applied, a gate electrode connected to a second node, and a second electrode connected to a third node; a light emitting element including an anode electrode connected to the third node, and a cathode electrode connected to a VSS line through which a pixel reference voltage lower than the pixel driving voltage is applied, and configured to be driven by a current from the driving element; a first switch element configured to supply the data voltage of the pixel data to the second node in response to a scan pulse; a second switch element configured to supply an initialization voltage to the second node in response to an initialization pulse; a third switch element configured to supply a reference voltage lower than the initialization voltage to the third node in response to a sensing pulse; a first capacitor connected between the second node and the third node; and a second capacitor connected between the VDD line and the third node, and having a capacitance smaller than that of the first capacitor.

In one embodiment, a pixel circuit comprises: a driving element including a first electrode of the driving element that is connected to a first node to which a pixel driving voltage is applied via a first power line, a gate electrode of the driving element that is connected to a second node, and a second electrode of the driving element that is connected to a third node; a light emitting element including an anode electrode that is connected to the third node, and a cathode electrode connected to a second power line through which a pixel reference voltage is applied, the light emitting element configured to be driven by a current from the driving element; a first switch element configured to supply a data voltage of pixel data of an image to the second node responsive to a scan pulse being applied to the first switch element; a second switch element configured to supply an initialization voltage to the second node responsive to an initialization pulse being applied to the second switch element; a third switch element configured to supply a reference voltage to the third node responsive to a sensing pulse being applied to the third switch element; a fourth switch element configured to connect the third node to the second power line responsive to an anode reset pulse being applied to the fourth switch element, the connection of the third node to the second power line resetting a voltage of the anode electrode of the light emitting element to the pixel reference voltage; and a capacitor connected between the second node and the third node.

In one embodiment, the first switch element includes a gate electrode of the first switch element to which the scan pulse is applied, a first electrode of the first switch element that is connected to a data line through which the data voltage is applied, and a second electrode of the first switch element that is connected to the second node, the second switch element includes a gate electrode of the second switch element to which the initialization pulse is applied, a first electrode of the second switch element to which the initialization voltage is applied, and a second electrode of the second switch element that is connected to the second node, the third switch element includes a gate electrode of the third switch element to which the sensing pulse is applied, a first electrode of the third switch element that is connected to the third node, and a second electrode of the third switch element that is connected to a reference line through which the reference voltage is applied, and the fourth switch element includes a gate electrode of the fourth switch element to which the anode reset pulse is applied, a first electrode of the fourth switch element that connected to the third node, and a second electrode of the fourth switch element that connected to the second power line.

In one embodiment, a driving period of the pixel circuit during which the image is displayed is divided into an initialization period, a sensing period, a data writing period, an anode reset period, a boosting period, and a light emission period, wherein in the initialization period, the initialization pulse and the sensing pulse are generated at a first on voltage, and the scan pulse and the anode reset pulse are at a first off voltage, in the sensing period, the initialization pulse is generated at the first on voltage, and the sensing pulse, the scan pulse, and the anode reset pulse are at the first off voltage, in the data writing period, the scan pulse is generated at the first on voltage such that the scan pulse is synchronized with the data voltage, and the initialization pulse, the sensing pulse, and the anode reset pulse are at the first off voltage, in the anode reset period, the anode reset pulse is generated at the first on voltage, and the initialization pulse, the sensing pulse, and the scan pulse are at the first off voltage, and in the boosting period and the light emission period, the initialization pulse, the sensing pulse, the scan pulse, and the anode reset pulse are at the first off voltage, and each of the first switch element to the fourth switch element is turned on responsive to the first on voltage, and each of the first switch element to the fourth switch element is turned off responsive to the first off voltage.

In one embodiment, a frequency of generation of the anode reset pulse at the first on voltage during a first frame frequency for displaying the image is the same as a frequency of generation of the anode reset pulse at the first on voltage during a second frame frequency for displaying the image that is different from the first frame frequency.

In one embodiment, the pixel circuit further comprises: one of a fifth-first switch element connected between the first node and the first power line through which the pixel driving voltage is applied, or a fifth-second switch element connected between the driving element and the light emitting element, wherein the fifth-first switch element or the fifth-second switch element are turned on responsive to a second on voltage of an emission control pulse and turned off responsive to a second off voltage of the emission control pulse, wherein the emission control pulse is generated at the second on voltage in initialization period, the sensing period, the data writing period, the boosting period, and the light emission period, and is generated at the second off voltage in the anode reset step.

In one embodiment, a frequency of generation of the anode reset pulse at the first on voltage during a first frame frequency for displaying the image is the same as a frequency of generation of the anode reset pulse at the first on voltage during a second frame frequency for displaying the image.

In one embodiment, a pixel circuit comprises: a driving element including a first electrode of the driving element that is connected to a first node to which a pixel driving voltage is applied via a first power line, a gate electrode of the driving element that is connected to a second node, and a second electrode of the driving element that is connected to a third node; a light emitting element including an anode electrode connected to the third node, and a cathode electrode connected to a second power line through which a pixel reference voltage that is less than the pixel driving voltage is applied, the light emitting element configured to be driven by a current from the driving element; a first switch element configured to supply a data voltage of pixel data of an image to the second node responsive to a scan pulse being applied to the first switch element; a second switch element configured to supply an initialization voltage to the second node responsive to an initialization pulse being applied to the second switch element; a third switch element configured to supply a reference voltage that is less than the initialization voltage to the third node while the data voltage is not supplied to the second node responsive to a sensing pulse being applied to the third switch element, the supply of the reference voltage to the third node resets a voltage of the anode electrode of the light emitting element to the reference voltage; a fourth switch element configured to connect the third node to a fourth node responsive to an anode reset pulse being applied to the fourth switch element; and a capacitor connected between the second node and the fourth node.

In one embodiment, the first switch element includes a gate electrode of the first switch element to which the scan pulse is applied, a first electrode of the first switch element that is connected to a data line through which the data voltage is applied, and a second electrode of the first switch element that is connected to the second node, the second switch element includes a gate electrode of the second switch element to which the initialization pulse is applied, a first electrode of the second switch element to which the initialization voltage is applied, and a second electrode of the second switch element that is connected to the second node, the third switch element includes a gate electrode of the third switch element to which the sensing pulse is applied, a first electrode of the third switch element that is connected to the third node, and a second electrode of the third switch element that is connected to a reference line through which the reference voltage is applied, and the fourth switch element includes a gate electrode of the fourth switch element to which the anode reset pulse is applied, a first electrode of the fourth switch element that is connected to the fourth node, and a second electrode of the fourth switch element that is connected to the third node.

In one embodiment, a driving period of the pixel circuit is divided into an initialization period, a sensing period, a data writing period, an anode reset period, a boosting period, and a light emission period, wherein in the initialization period, the initialization pulse, the sensing pulse, and the anode reset pulse are generated at a first on voltage, and the scan pulse is at a first off voltage, in the sensing period, the initialization pulse and the anode reset pulse are generated at the first on voltage, and the sensing pulse and the scan pulse are at the first off voltage, in the data writing period, the scan pulse and the anode reset pulse are generated at the first on voltage, and the initialization pulse and the sensing pulse are at the first off voltage, in the anode reset period, the sensing pulse is generated at the first on voltage, and the initialization pulse, the scan pulse, and the anode reset pulse are at the first off voltage, and in the boosting period and the light emission period, the anode reset pulse is generated at the first on voltage, and the initialization pulse, the sensing pulse, and the scan pulse are at the first off voltage, and each of the first switch element to the fourth switch element is turned on responsive to the first on voltage, and is turned off responsive to the first off voltage.

In one embodiment, a frequency of generation of the anode reset pulse at the first off voltage during a first frame frequency for displaying the image is the same as a frequency of generation of the anode reset pulse at the first off voltage during a second frame frequency for displaying the image.

In one embodiment, the pixel circuit further comprises: a fifth-first switch element connected between the first node and the first power line through which the pixel driving voltage is applied, or a fifth-second switch element connected between the driving element and the light emitting element, wherein the fifth-first switch element or the fifth-second switch element are turned on responsive to a second on voltage of an emission control pulse and turned off responsive to a second off voltage of the emission control pulse, wherein the emission control pulse is generated at the second on voltage in the initialization period, the sensing period, the data writing period, the boosting period, and the light emission period, and the emission control pulse is generated at the second off voltage in the anode reset step.

In one embodiment, a frequency of generation of the anode reset pulse at the first off voltage during a first frame frequency for displaying the image is the same as a frequency of generation of the anode reset pulse at the first off voltage during a second frame frequency for displaying the image.

In one embodiment, a display device comprises: a display panel including a plurality of pixels configured to display an image at one of a plurality of different frame frequencies, the plurality of different frame frequencies including a first frame frequency and a second frame frequency that is different from the first frame frequency; a data driver configured to generate a data voltage of pixel data of the image; and a gate driver configured to generate a scan pulse, wherein at least one of the plurality of pixel circuits includes: a driving element including a first electrode of the driving element that is connected to a first node to which a pixel driving voltage is applied via a first power line, a gate electrode of the driving element that is connected to a second node, and a second electrode of the driving element that is connected to a third node; a light emitting element including an anode electrode connected to the third node, and a cathode electrode connected to a second power line through which a pixel reference voltage that is less than the pixel driving voltage is applied, the light emitting element configured to be driven by a current from the driving element; a first switch element configured to supply the data voltage of the pixel data of the image to the second node responsive to the scan pulse being applied to the first switch element; and a second switch element connected to the third node, the second switch element configured to supply a predetermined voltage to the anode electrode of the light emitting element while the data voltage is not supplied to the second node, the supply of the predetermined voltage resetting a voltage of the anode electrode of the light emitting element to the predetermined voltage.

In one embodiment, a frequency at which the predetermined voltage is supplied to the anode electrode of the light emitting element during the first frame frequency is a same as a frequency at which the predetermined voltage is supplied to the anode electrode of the light emitting element during the second frame frequency.

In one embodiment, the frequency at which the predetermined voltage is supplied during the first frame frequency and the frequency at which the predetermined voltage is supplied during the second frame frequency matches a fastest frame frequency from the plurality of different frame frequencies.

In one embodiment, the gate driver is further configured to generate an anode reset pulse, and wherein the second switch element further includes: a gate electrode of the second switch element to which the anode reset pulse is applied, a first electrode of the second switch element that is connected to the third node, and a second electrode of the second switch element that is connected to a second power line through which the predetermined voltage is applied, wherein the predetermined voltage is less than the pixel driving voltage.

In one embodiment, the gate driver is further configured to generate a sensing pulse and the at least one of the plurality of pixel circuits further includes: a third switch element including a gate electrode of the third switch element to which the sensing pulse is applied, a first electrode of the third switch element that is connected to the third node, and a second electrode of the third switch element that is connected to a reference line through which a reference voltage is applied, wherein the reference voltage is less than the pixel driving voltage but greater than the predetermined voltage.

In one embodiment, the gate driver is further configured to generate a sensing pulse, and wherein the second switch element further includes: a gate electrode of the second switch element to which the sensing pulse is applied, a first electrode of the second switch element that is connected to the third node, and a second electrode of the third switch element that is connected to a reference line through which the predetermined voltage is applied, wherein the predetermined voltage is less than the pixel driving voltage.

In one embodiment, the gate driver is further configured to generate an anode reset pulse, and the at least one of the plurality of pixel circuits further includes: a capacitor connected between the second node and a fourth node; and a third switch element including a gate electrode of the third switch element to which the anode reset pulse is applied, a first electrode of the third switch element that is connected to the third node, and a second electrode of the third switch element that is connected to the fourth node, wherein the third switch element is configured to be off while the second switch element is on.

In one embodiment, at least one of the plurality of pixel circuits further includes: a first capacitor connected between the second node and the third node; and a second capacitor connected between the first power line and the third node.

The objects to be achieved by the present disclosure, the means for achieving the objects, and effects of the present disclosure described above do not specify essential features of the claims, and thus, the scope of the claims is not limited to the disclosure of the present disclosure.

Although the embodiments of the present disclosure have been described in more detail with reference to the accompanying drawings, the present disclosure is not limited thereto and may be embodied in many different forms without departing from the technical concept of the present disclosure. Therefore, the embodiments disclosed in the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A pixel circuit comprising:
   a driving element including a first electrode of the driving element that is connected to a first node to which a pixel driving voltage is applied via a first power line, a gate electrode of the driving element that is connected to a second node, and a second electrode of the driving element that is connected to a third node;
   a light emitting element including an anode electrode that is connected to the third node, and a cathode electrode connected to a second power line through which a pixel reference voltage is applied, the light emitting element configured to be driven by a current from the driving element;

a first switch element configured to supply a data voltage of pixel data of an image to the second node responsive to a scan pulse being applied to the first switch element;

a second switch element configured to supply an initialization voltage to the second node responsive to an initialization pulse being applied to the second switch element;

a third switch element configured to supply a reference voltage that is less than the initialization voltage to the third node responsive to a sensing pulse being applied to the third switch element;

a fourth switch element configured to be turned on to connect the third node to the second power line while the third switch element is off responsive to an anode reset pulse being applied to the fourth switch element, the connection of the third node to the second power line resetting a voltage of the anode electrode of the light emitting element to the pixel reference voltage; and a capacitor connected between the second node and the third node.

2. The pixel circuit of claim 1, wherein the first switch element includes a gate electrode of the first switch element to which the scan pulse is applied, a first electrode of the first switch element that is connected to a data line through which the data voltage is applied, and a second electrode of the first switch element that is connected to the second node, the second switch element includes a gate electrode of the second switch element to which the initialization pulse is applied, a first electrode of the second switch element to which the initialization voltage is applied, and a second electrode of the second switch element that is connected to the second node, the third switch element includes a gate electrode of the third switch element to which the sensing pulse is applied, a first electrode of the third switch element that is connected to the third node, and a second electrode of the third switch element that is connected to a reference line through which the reference voltage is applied, and the fourth switch element includes a gate electrode of the fourth switch element to which the anode reset pulse is applied, a first electrode of the fourth switch element that connected to the third node, and a second electrode of the fourth switch element that connected to the second power line.

3. The pixel circuit of claim 1, wherein a driving period of the pixel circuit during which the image is displayed is divided into an initialization period, a sensing period, a data writing period, an anode reset period, a boosting period, and a light emission period, wherein in the initialization period, the initialization pulse and the sensing pulse are generated at a first on voltage, and the scan pulse and the anode reset pulse are at a first off voltage, in the sensing period, the initialization pulse is generated at the first on voltage, and the sensing pulse, the scan pulse, and the anode reset pulse are at the first off voltage, in the data writing period, the scan pulse is generated at the first on voltage such that the scan pulse is synchronized with the data voltage, and the initialization pulse, the sensing pulse, and the anode reset pulse are at the first off voltage, in the anode reset period, the anode reset pulse is generated at the first on voltage, and the initialization pulse, the sensing pulse, and the scan pulse are at the first off voltage, and in the boosting period and the light emission period, the initialization pulse, the sensing pulse, the scan pulse, and the anode reset pulse are at the first off voltage, and each of the first switch element to the fourth switch element is turned on responsive to the first on voltage, and each of the first switch element to the fourth switch element is turned off responsive to the first off voltage.

4. The pixel circuit of claim 1, wherein a frequency of generation of the anode reset pulse at the first on voltage during a first frame frequency for displaying the image is the same as a frequency of generation of the anode reset pulse at the first on voltage during a second frame frequency for displaying the image that is different from the first frame frequency.

5. The pixel circuit of claim 3, further comprising:

one of a fifth-first switch element connected between the first node and the first power line through which the pixel driving voltage is applied, or a fifth-second switch element connected between the driving element and the light emitting element, wherein the fifth-first switch element or the fifth-second switch element are turned on responsive to a second on voltage of an emission control pulse and turned off responsive to a second off voltage of the emission control pulse, wherein the emission control pulse is generated at the second on voltage in initialization period, the sensing period, the data writing period, the boosting period, and the light emission period, and is generated at the second off voltage in the anode reset step.

6. The pixel circuit of claim 5, wherein a frequency of generation of the anode reset pulse at the first on voltage during a first frame frequency for displaying the image is the same as a frequency of generation of the anode reset pulse at the first on voltage during a second frame frequency for displaying the image.

7. A pixel circuit comprising:

a driving element including a first electrode of the driving element that is connected to a first node to which a pixel driving voltage is applied via a first power line, a gate electrode of the driving element that is connected to a second node, and a second electrode of the driving element that is connected to a third node;

a light emitting element including an anode electrode connected to the third node, and a cathode electrode connected to a second power line through which a pixel reference voltage that is less than the pixel driving voltage is applied, the light emitting element configured to be driven by a current from the driving element;

a first switch element configured to supply a data voltage of pixel data of an image to the second node responsive to a scan pulse being applied to the first switch element;

a second switch element configured to supply an initialization voltage to the second node responsive to an initialization pulse being applied to the second switch element;

a third switch element configured to supply a reference voltage that is less than the initialization voltage to the third node while the data voltage is not supplied to the second node and while the second switch element is turned off responsive to a sensing pulse being applied to the third switch element, the supply of the reference voltage to the third node resets a voltage of the anode electrode of the light emitting element to the reference voltage;

a fourth switch element configured to connect the third node to a fourth node responsive to an anode reset pulse being applied to the fourth switch element; and a capacitor connected between the second node and the fourth node.

8. The pixel circuit of claim 7, wherein the first switch element includes a gate electrode of the first switch element to which the scan pulse is applied, a first electrode of the first switch element that is connected to a data line through which the data voltage is applied, and a second electrode of the first switch element that is connected to the second node, the second switch element includes a gate electrode of the second switch element to which the initialization pulse is applied, a first electrode of the second switch element to which the initialization voltage is applied, and a second electrode of the second switch element that is connected to the second node, the third switch element includes a gate electrode of the third switch element to which the sensing pulse is applied, a first electrode of the third switch element that is connected to the third node, and a second electrode of the third switch element that is connected to a reference line through which the reference voltage is applied, and the fourth switch element includes a gate electrode of the fourth switch element to which the anode reset pulse is applied, a first electrode of the fourth switch element that is connected to the fourth node, and a second electrode of the fourth switch element that is connected to the third node.

9. The pixel circuit of claim 7, wherein a driving period of the pixel circuit is divided into an initialization period, a sensing period, a data writing period, an anode reset period, a boosting period, and a light emission period, wherein in the initialization period, the initialization pulse, the sensing pulse, and the anode reset pulse are generated at a first on voltage, and the scan pulse is at a first off voltage, in the sensing period, the initialization pulse and the anode reset pulse are generated at the first on voltage, and the sensing pulse and the scan pulse are at the first off voltage, in the data writing period, the scan pulse and the anode reset pulse are generated at the first on voltage, and the initialization pulse and the sensing pulse are at the first off voltage, in the anode reset period, the sensing pulse is generated at the first on voltage, and the initialization pulse, the scan pulse, and the anode reset pulse are at the first off voltage, and in the boosting period and the light emission period, the anode reset pulse is generated at the first on voltage, and the initialization pulse, the sensing pulse, and the scan pulse are at the first off voltage, and each of the first switch element to the fourth switch element is turned on responsive to the first on voltage, and is turned off responsive to the first off voltage.

10. The pixel circuit of claim 7, wherein a frequency of generation of the anode reset pulse at the first off voltage during a first frame frequency for displaying the image is the same as a frequency of generation of the anode reset pulse at the first off voltage during a second frame frequency for displaying the image.

11. The pixel circuit of claim 9, further comprising:

a fifth-first switch element connected between the first node and the first power line through which the pixel driving voltage is applied, or a fifth-second switch element connected between the driving element and the light emitting element, wherein the fifth-first switch element or the fifth-second switch element are turned on responsive to a second on voltage of an emission control pulse and turned off responsive to a second off voltage of the emission control pulse, wherein the emission control pulse is generated at the second on voltage in the initialization period, the sensing period, the data writing period, the boosting period, and the light emission period, and the emission control pulse is generated at the second off voltage in the anode reset step.

12. The pixel circuit of claim 11, wherein a frequency of generation of the anode reset pulse at the first off voltage during a first frame frequency for displaying the image is the same as a frequency of generation of the anode reset pulse at the first off voltage during a second frame frequency for displaying the image.

13. A display device comprising:

a display panel including a plurality of pixels configured to display an image at one of a plurality of different frame frequencies, the plurality of different frame frequencies including a first frame frequency and a second frame frequency that is different from the first frame frequency;

a data driver configured to generate a data voltage of pixel data of the image; and a gate driver configured to generate a scan pulse, wherein at least one of the plurality of pixel circuits includes:

a driving element including a first electrode of the driving element that is connected to a first node to which a pixel driving voltage is applied via a first power line, a gate electrode of the driving element that is connected to a second node, and a second electrode of the driving element that is connected to a third node;

a light emitting element including an anode electrode connected to the third node, and a cathode electrode connected to a second power line through which a pixel reference voltage that is less than the pixel driving voltage is applied, the light emitting element configured to be driven by a current from the driving element;

a first switch element configured to supply the data voltage of the pixel data of the image to the second node responsive to the scan pulse being applied to the first switch element; and a second switch element connected to the third node, the second switch element configured to supply a predetermined voltage to the anode electrode of the light emitting element while the data voltage is not supplied to the second node, the supply of the predetermined voltage resetting a voltage of the anode electrode of the light emitting element to the predetermined voltage, wherein a frequency at which the predetermined voltage is supplied to the anode electrode of the light emitting element a plurality of times during the first frame frequency is a same as a frequency at which the predetermined voltage is supplied to the anode electrode of the light emitting element a plurality of times during the second frame frequency.

14. The display device of claim 13, wherein the frequency at which the predetermined voltage is supplied during the first frame frequency and the frequency at which the predetermined voltage is supplied during the second frame frequency matches a fastest frame frequency from the plurality of different frame frequencies.

15. The display device of claim 13, wherein the gate driver is further configured to generate an anode reset pulse, and wherein the second switch element further includes:
a gate electrode of the second switch element to which the anode reset pulse is applied, a first electrode of the second switch element that is connected to the third node, and a second electrode of the second switch element that is connected to a second power line through which the predetermined voltage is applied,
wherein the predetermined voltage is less than the pixel driving voltage.

16. The display device of claim 13, wherein the gate driver is further configured to generate a sensing pulse and the at least one of the plurality of pixel circuits further includes:
a third switch element including a gate electrode of the third switch element to which the sensing pulse is applied, a first electrode of the third switch element that is connected to the third node, and a second electrode of the third switch element that is connected to a reference line through which a reference voltage is applied,
wherein the reference voltage is less than the pixel driving voltage but greater than the predetermined voltage.

17. The display device of claim 13, wherein the gate driver is further configured to generate a sensing pulse, and wherein the second switch element further includes:
a gate electrode of the second switch element to which the sensing pulse is applied, a first electrode of the second switch element that is connected to the third node, and a second electrode of the third switch element that is connected to a reference line through which the predetermined voltage is applied,
wherein the predetermined voltage is less than the pixel driving voltage.

18. The display device of claim 13, wherein the gate driver is further configured to generate an anode reset pulse, and the at least one of the plurality of pixel circuits further includes:
a capacitor connected between the second node and a fourth node, and
wherein the second switch element further includes a gate electrode of the second switch element to which the anode reset pulse is applied, a first electrode of the second switch element that is connected to the third node, and a second electrode of the second switch element that is connected to the fourth node.

19. The display device of claim 13, wherein the at least one of the plurality of pixel circuits further includes:
a first capacitor connected between the second node and the third node; and
a second capacitor connected between the first power line and the third node.

* * * * *